(12) United States Patent
D'Andrade et al.

(10) Patent No.: US 8,053,770 B2
(45) Date of Patent: Nov. 8, 2011

(54) EMISSIVE LAYER PATTERNING FOR OLED

(75) Inventors: Brian D'Andrade, Westampton, NJ (US); Michael S. Weaver, Princeton, NJ (US); Julia J. Brown, Yardley, PA (US)

(73) Assignee: Universal Display Corporation, Ewing, NJ (US)

( * ) Notice: Subject to any disclaimer, the term of this patent is extended or adjusted under 35 U.S.C. 154(b) by 113 days.

(21) Appl. No.: 12/577,482

(22) Filed: Oct. 12, 2009

(65) Prior Publication Data

US 2010/0090241 A1    Apr. 15, 2010

Related U.S. Application Data

(60) Provisional application No. 61/105,210, filed on Oct. 14, 2008.

(51) Int. Cl.
*H01L 29/08* (2006.01)
*H01L 35/24* (2006.01)
*H01L 51/00* (2006.01)

(52) U.S. Cl. ............ 257/40; 257/79; 257/80; 257/89; 257/72; 438/22; 438/99; 438/28; 438/34

(58) Field of Classification Search ........ 257/E29.038, 257/98, 40, 79, 80, 88, 89, 10, 758, 759, 257/635, 642, 84, 184, 72; 438/22, 28, 27, 438/34, 99; 445/33
See application file for complete search history.

(56) References Cited

U.S. PATENT DOCUMENTS 4,769,292 A    9/1988 Tang et al.
(Continued)

FOREIGN PATENT DOCUMENTS

EP    0650955    5/1995
(Continued)

OTHER PUBLICATIONS

Baldo et al., "Highly Efficient Phosphorescent Emission from Organic Electroluminescent Devices," Nature, vol. 395, 151-154, 1998.
(Continued)

*Primary Examiner* — Ha Tran T Nguyen
*Assistant Examiner* — Thanh Y Tran
(74) *Attorney, Agent, or Firm* — Kilpatrick Townsend & Stockton LLP

(57) ABSTRACT

An organic light emitting device is provided. The device includes an anode, a cathode, and an organic emissive stack disposed between the anode and the cathode. The device may be a "pixel" in a display, capable of emitting a wide variety of colors through the use of independently addressable "subpixels," each subpixel emitting a different spectrum of light. In the most general sense, the device includes a first subpixel and a second subpixel, and at least one of the anode and the cathode has independently addressable first and second regions corresponding to the first and second subpixels. The device includes an emissive stack disposed between the anode and the cathode. The emissive stack includes a first organic emissive layer and a second organic emissive layer. The first organic emissive layer is disposed between the anode and the cathode, and extends throughout the first and second regions. The second organic emissive layer is disposed between the anode and the cathode, and extends throughout the second region but not the first region. The second organic emissive layer is disposed closer to the cathode than the first organic emissive layer. The first organic emissive layer is emissive in the first region, and the second organic emissive layer is emissive in the second region.

17 Claims, 11 Drawing Sheets

U.S. PATENT DOCUMENTS

| | | | |
|---|---|---|---|
| 5,061,569 | A | 10/1991 | VanSlyke et al. |
| 5,247,190 | A | 9/1993 | Friend et al. |
| 5,703,436 | A | 12/1997 | Forrest et al. |
| 5,707,745 | A | 1/1998 | Forrest et al. |
| 5,834,893 | A | 11/1998 | Bulovic et al. |
| 5,844,363 | A | 12/1998 | Gu et al. |
| 6,013,982 | A | 1/2000 | Thompson et al. |
| 6,087,196 | A | 7/2000 | Sturm et al. |
| 6,091,195 | A | 7/2000 | Forrest et al. |
| 6,097,147 | A | 8/2000 | Baldo et al. |
| 6,294,398 | B1 | 9/2001 | Kim et al. |
| 6,303,238 | B1 | 10/2001 | Thompson et al. |
| 6,337,102 | B1 | 1/2002 | Forrest et al. |
| 6,468,819 | B1 | 10/2002 | Kim et al. |
| 6,687,266 | B1 | 2/2004 | Ma et al. |
| 6,835,469 | B2 | 12/2004 | Kwong et al. |
| 6,891,326 | B2 | 5/2005 | Lu |
| 7,087,321 | B2 | 8/2006 | Kwong et al. |
| 7,279,704 | B2 | 10/2007 | Walters et al. |
| 2002/0034656 | A1 | 3/2002 | Thompson et al. |
| 2002/0134984 | A1 | 9/2002 | Igarashi |
| 2003/0175553 | A1 | 9/2003 | Thompson et al. |
| 2003/0230980 | A1 | 12/2003 | Forrest et al. |
| 2004/0174116 | A1 | 9/2004 | Lu et al. |
| 2004/0222736 | A1* | 11/2004 | Yoneda .......................... 313/503 |
| 2005/0025993 | A1 | 2/2005 | Thompson et al. |
| 2005/0260441 | A1 | 11/2005 | Thompson et al. |
| 2005/0260449 | A1 | 11/2005 | Walters et al. |
| 2006/0008670 | A1 | 1/2006 | Lin et al. |
| 2006/0017055 | A1* | 1/2006 | Cropper et al. ................. 257/77 |
| 2006/0108592 | A1 | 5/2006 | Nishimura et al. |
| 2006/0202194 | A1 | 9/2006 | Jeong et al. |
| 2006/0238120 | A1 | 10/2006 | Miller et al. |
| 2006/0250079 | A1* | 11/2006 | Kwok et al. .................. 313/506 |
| 2006/0251923 | A1 | 11/2006 | Lin et al. |
| 2007/0046195 | A1 | 3/2007 | Chin et al. |
| 2007/0120467 | A1 | 5/2007 | Feng et al. |
| 2007/0190359 | A1 | 8/2007 | Knowles et al. |

FOREIGN PATENT DOCUMENTS

| | | |
|---|---|---|
| JP | 200511610 | 1/2005 |
| JP | 2007123392 | 5/2007 |
| JP | 2007254297 | 10/2007 |
| WO | 0139234 | 5/2001 |
| WO | 0202714 | 1/2002 |
| WO | 03040257 | 5/2003 |
| WO | 03060956 | 7/2003 |
| WO | 2004093207 | 10/2004 |
| WO | 2004107822 | 12/2004 |
| WO | 2005014551 | 2/2005 |
| WO | 2005030900 | 4/2005 |
| WO | 2005089025 | 9/2005 |
| WO | 2005123873 | 12/2005 |
| WO | 2006009024 | 1/2006 |
| WO | 2006056418 | 6/2006 |
| WO | 2006082742 | 8/2006 |
| WO | 2006098120 | 9/2006 |
| WO | 2006103874 | 10/2006 |
| WO | 2006114966 | 11/2006 |
| WO | 2006132173 | 12/2006 |
| WO | 2007004380 | 1/2007 |
| WO | 2007063754 | 6/2007 |
| WO | 2007063796 | 6/2007 |

OTHER PUBLICATIONS

Baldo et al., "Very high-efficiency green organic light-emitting devices based on electrophosphorescence," Appl. Phys. Lett., vol. 75, No. 3, 4-6 (1999).

Dodabalapur et al., Physics and applications of organic microcavity light emitting diodes, J. Appl. Phys. 80 (12), Dec. 15, 1996, pp. 6954-6964.

Kim et al., "Control of Emission Zone in a Full Color AMOLED with a Blue Common Layer", SID 06 Digest, pp. 135-138.

Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino)triphenylamine (m-MTDATA), as Hole-Transport Materials," Adv. Mater., 6(9):677-679 (1994).

Paulose, Betty Marie Jennifer S. et al., "First Examples of Alkenyl Pyridines as Organic Ligands for Phosphorescent Iridium Complexes," Adv. Mater., 16(22):2003-2007 (2004).

Tung, Yung-Liang et al., "Organic Light-Emitting Diodes Based on Charge-Neutral $Ru^{II}$ PHosphorescent Emitters," Adv. Mater., 17(8):1059-1064 (2005).

Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," Adv. Mater., 19:739-743 (2007).

Wong, Wai-Yeung, "Multifunctional Iridium Complexes Based on Carbazole Modules as Highly Efficient Electrophosphors," Angew. Chem. Int. Ed., 45:7800-7803 (2006).

Tang, C.W. and VanSlyke, S.A., "Organic Electroluminescent Diodes," Appl. Phys. Lett., 51(12):913-915 (1987).

Adachi, Chihaya et al., "Organic Electroluminescent Device Having a Hole Conductor as an Emitting Layer," Appl. Phys. Lett., 55(15):1489-1491 (1989).

Ma, Yuguang et al., "Triplet Luminescent Dinuclear-Gold(I) Complex-Based Light-Emitting Diodes with Low Turn-On voltage," Appl. Phys. Lett., 74(10):1361-1363 (1999).

Gao, Zhiqiang et al., "Bright-Blue Electroluminescence From a Silyl-Substituted ter-(phenylene-vinylene) derivative," Appl. Phys. Lett., 74(6):865-867 (1999).

Lee, Chang-Lyoul et al., "Polymer Phosphorescent Light-Emitting Devices Doped with Tris(2-phenylpyridine) Iridium as a Triplet Emitter," Appl. Phys. Lett., 77(15):2280-2282 (2000).

Hung, L.S. et al., "Anode Modification in Organic Light-Emitting Diodes by Low-Frequency Plasma Polymerization of $CHF_3$," Appl. Phys. Lett., 78(5):673-675 (2001).

Ikai, Masamichi and Tokito, Shizuo, "Highly Efficient Phosphorescence From Organic Light-Emitting Devices with an Exciton-Block Layer," Appl. Phys. Lett., 79(2):156-158 (2001).

Wang, Y. et al., "Highly Efficient Electroluminescent Materials Based on Fluorinated Organometallic Iridium Compounds," Appl. Phys. Lett., 79(4):449-451 (2001).

Kwong, Raymond C. et al., "High Operational Stability of Electrophosphorescent Devices," Appl. Phys. Lett., 81(1):162-164 (2002).

Holmes, R.J. et al., "Blue Organic Electrophosphorescence Using Exothermic Host-Guest Energy Transfer," Appl. Phys. Lett., 82(15):2422-2424 (2003).

Sotoyama, Wataru et al., "Efficient Organic LIght-Emitting Diodes with Phosphorescent Platinum Complexes Containing N∧C∧N-Coordinating Tridentate Ligand," Appl. Phys. Lett., 86:153505-1—153505-3 (2005).

Okumoto, Kenji et al., "Green Fluorescent Organic Light-Emitting Device with External Quantum Efficiency of Nearly 10%," Appl. Phys. Lett., 89:063504-1—063504-3 (2006).

Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1—123509-3 (2007).

Aonuma, Masaki et al., "Material Design of Hole Transport Materials Capable of Thick-Film Formation in Organic Light Emitting Diodes," Appl. Phys. Lett., 90:183503-1—183503-3 (2007).

Sun, Yiru and Forrest, Stephen R., "High-Efficiency White Organic Light Emitting Devices with Three Separate Phosphorescent Emission Layers," Appl. Phys. Lett., 91:263503-1—263503-3 (2007).

Adachi, Chihaya et al., "High-Efficiency Red Electrophosphorescence Devices," Appl. Phys. Lett., 78(11):1622-1624 (2001).

Wong, Keith Man-Chung et al., A Novel Class of Phosphorescent Gold(III) Alkynyl-Based Organic Light-Emitting Devices with Tunable Colour, Chem. Commun., 2906-2908 (2005).

Hamada, Yuji et al., "High Luminance in Organic Electroluminescent Devices with Bis(10-hydroxybenzo[h]quinolinato)beryllium as an Emitter," Chem. Lett., 905-906 (1993).

Nishida, Jun-ichi et al., "Preparation, Characterization, and Electroluminescence Characteristics of α-Diimine-type Platinum(II) Complexes with Perfluorinated Phenyl Groups as Ligands," Chem. Lett., 34(4):592-593 (2005).

Mi, Bao-Xiu et al., "Thermally Stable Hole-Transporting Material for Organic Light-Emitting Diode: an Isoindole Derivative," Chem. Mater., 15(16):3148-3151 (2003).

Huang, Wei-Sheng et al., "Highly Phosphorescent Bis-Cyclometalated Iridium Complexes Containing Benzoimidazole-Based Ligands," Chem. Mater., 16(12):2480-2488 (2004).

Niu, Yu-Hua et al., "Highly Efficient Electrophosphorescent Devices with Saturated Red Emission from a Neutral Osmium Complex," Chem. Mater., 17(13):3532-3536 (2005).

Lo, Shih-Chun et al., "Blue Phosphorescence from Iridium(III) Complexes at Room Temperature," Chem. Mater., 18(21):5119-5129 (2006).

Takizawa, Shin-ya et al., "Phosphorescent Iridium Complexes Based on 2-Phenylimidazo[1,2-α]pyridine Ligands: Tuning of Emission Color toward the Blue Region and Application to Polymer Light-Emitting Devices," Inorg. Chem., 46(10):4308-4319 (2007).

Lamansky, Sergey et al., "Synthesis and Characterization of Phosphorescent Cyclometalated Iridium Complexes," Inorg. Chem., 40(7):1704-1711 (2001).

Ranjan, Sudhir et al., "Realizing Green Phosphorescent Light-Emitting Materials from Rhenium(I) Pyrazolato Diimine Complexes," Inorg. Chem., 42(4):1248-1255 (2003).

Noda, Tetsuya and Shirota,Yasuhiko, "5,5'-Bis(dimesitylboryl)-2,2'-bithiophene and 5,5''-Bis(dimesitylboryl)-2,2':5',2''-terthiophene as a Novel Family of Electron-Transporting Amorphous Molecular Materials," J. Am. Chem. Soc., 120 (37):9714-9715 (1998).

Sakamoto,Youichi et al., "Synthesis, Characterization, and Electron-Transport Property of Perfluorinated Phenylene Dendrimers," J. Am. Chem. Soc., 122(8):1832-1833 (2000).

Adachi, Chihaya et al., "Nearly 100% Internal Phosphorescence Efficiency in an Organic Light Emitting Device," J. Appl. Phys., 90(10):5048-5051 (2001).

Shirota, Yasuhiko et al., "Starburst Molecules Based on π-Electron Systems as Materials for Organic Electroluminescent Devices," Journal of Luminescence, 72-74:985-991 (1997).

Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater. Chem., 3(3):319-320 (1993).

Kido, Junji et al., 1,2,4-Triazole Derivative as an Electron Transport Layer in Organic Electroluminescent Devices, Jpn. J. Appl. Phys., 32:L917-L920 (1993).

Van Slyke, S. A. et al., "Organic Electroluminescent Devices with Improved Stability," Appl. Phys. Lett., 69(15):2160-2162 (1996).

Baldo, M. A. et al., "Highly Efficient Phosphorescent Emission From Organic Electroluminescent Devices," Nature, 395:151-154 (1998).

Guo, Tzung-Fang et al., "Highly Efficient Electrophosphorescent Polymer Light-Emitting Devices," Organic Electronics, 1:15-20 (2000).

Palilis, Leonidas C., "High Efficiency Molecular Organic Light-Emitting Diodes Based on Silole Derivatives and Their Exciplexes," Organic Electronics, 4:113-121 (2003).

Ikeda, Hisao et al., "P-185: Low-Drive-Voltage OLEDs with a Buffer Layer Having Molybdenum Oxide," SID Symposium Digest, 37:923-926 (2006).

T. Östergård et al., "Langmuir-Blodgett Light-Emitting Diodes of Poly(3-Hexylthiophene): Electro-Optical Characteristics Related to Structure," Synthetic Metals, 87:171-177 (1997).

Hu, Nan-Xing et al., "Novel High $T_g$ Hole-Transport Molecules Based on Indolo[3,2-b]carbazoles for Organic Light-Emitting Devices," Synthetic Metals, 111-112:421-424 (2000).

Salbeck, J. et al., "Low Molecular Organic Glasses for Blue Electroluminescence," Synthetic Metals, 91:209-215 (1997).

International Search Report/Written Opinion corresponding to the PCT/US2009/060641 application.

U.S. Appl. No. 10/233,470, filed Sep. 4, 2002.

\* cited by examiner

EMISSIVE LAYER PATTERNING FOR OLED

This application claims priority to and benefit under 35 U.S.C. §119(e) to U.S. Provisional Application No. 61/105,210, filed Oct. 14, 2008, the disclosures of which are herein expressly incorporated by reference in their entirety.

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices, and more particularly to organic light emitting devices having a patterned emissive layer.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the structure of Formula I:

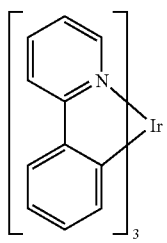

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

An organic light emitting device is provided. The device includes an anode, a cathode, and an organic emissive stack disposed between the anode and the cathode. The device may be a "pixel" in a display, capable of emitting a wide variety of colors through the use of independently addressable "subpixels," each subpixel emitting a different spectrum of light. In the most general sense, the device includes a first subpixel and a second subpixel, and at least one of the anode and the cathode has independently addressable first and second regions corresponding to the first and second subpixels. The device includes an emissive stack disposed between the anode and the cathode. The emissive stack includes a first organic emissive layer and a second organic emissive layer. The first organic emissive layer is disposed between the anode and the cathode, and extends throughout the first and second regions. The second organic emissive layer is disposed between the anode and the cathode, and extends throughout the second region but not the first region. The second organic emissive layer is disposed closer to the cathode than the first organic emissive layer. The first organic emissive layer is emissive in the first region, and the second organic emissive layer is emissive in the second region.

The device may further include a third subpixel, where at least one of the anode and the cathode has independently addressable first, second and third regions corresponding to the first, second and third subpixels. The first organic emissive layer may extend throughout the first, second and third regions. The emissive stack may further include a third organic emissive layer disposed between the anode and the cathode, extending throughout the third region but not throughout all of the first, second and third regions. The third organic emissive layer may be disposed closer to the anode or the cathode than the first organic emissive layer. The second organic emissive layer may extend throughout the second region but not the first and third regions, or the second organic emissive layer may extend throughout the second and third regions but not the first region.

The device may further include a fourth subpixel, where at least one of the anode and the cathode has independently addressable first, second third and fourth regions corresponding to the first, second and third subpixels. The first organic emissive layer may extend throughout the first, second, third and fourth regions. The emissive stack may further include a fourth organic emissive layer disposed between the anode and the cathode, extending throughout the fourth region but not throughout all of the first, second and third regions. The fourth organic emissive layer may be disposed closer to the anode or the cathode than the first organic emissive layer. The second organic emissive layer may extend throughout the second region but not the first and third regions, or the second organic emissive layer may extend throughout the second and third regions but not the first region.

Preferably, but not necessarily, the first organic emissive layer is a blanket layer, which allows an emissive spectra to be obtained without a fine patterning or high resolution patterning step. A blanket layer may still allow for some large scale patterning, for example, to define a macro scale display or lighting area and prevent deposition on the periphery of the display or lighting region.

The emissive stack may include a non-emissive spacer layer disposed between the first organic emissive layer and the second organic emissive layer. Or, the first and second organic emissive layers may be in direct contact. A wide variety of configurations incorporating non-emissive spacer layers in various ways may be used.

Each emissive layer is emissive in at least one region of the device, but is not necessarily emissive in each region where it is present. The first organic emissive layer may be emissive in the second region, or may not be emissive in the second region.

It is preferred that emissive layers include a phosphorescent emissive material, but other emissive materials such as fluorescent materials may be used. It is preferred that the first emissive layer include a phosphorescent dopant. It is preferred that the first emissive layer include a phosphorescent dopant that has a peak emissive wavelength in the visible spectrum of 500 nm-600 nm.

A method of fabricating a device is provided. The device has a first subpixel and a second subpixel, and an anode and a cathode, wherein at least one of the anode and the cathode has independently addressable first and second regions corresponding to the first and second subpixels. The method includes providing the anode, then depositing, without the use of a mask, a first organic emissive layer over the anode, the first organic emissive layer extending throughout the first and second regions. A second organic emissive layer may then be deposited over the first organic emissive layer, the second organic emissive layer extending throughout the second region but not the first region. A cathode may then be deposited over the second organic emissive layer. The first organic emissive layer is emissive in the first region, and the second organic emissive layer is emissive in the second region. The order of deposition may be varied, such that the anode is on top, so long as the first organic emissive layer is closer to the anode than the cathode.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
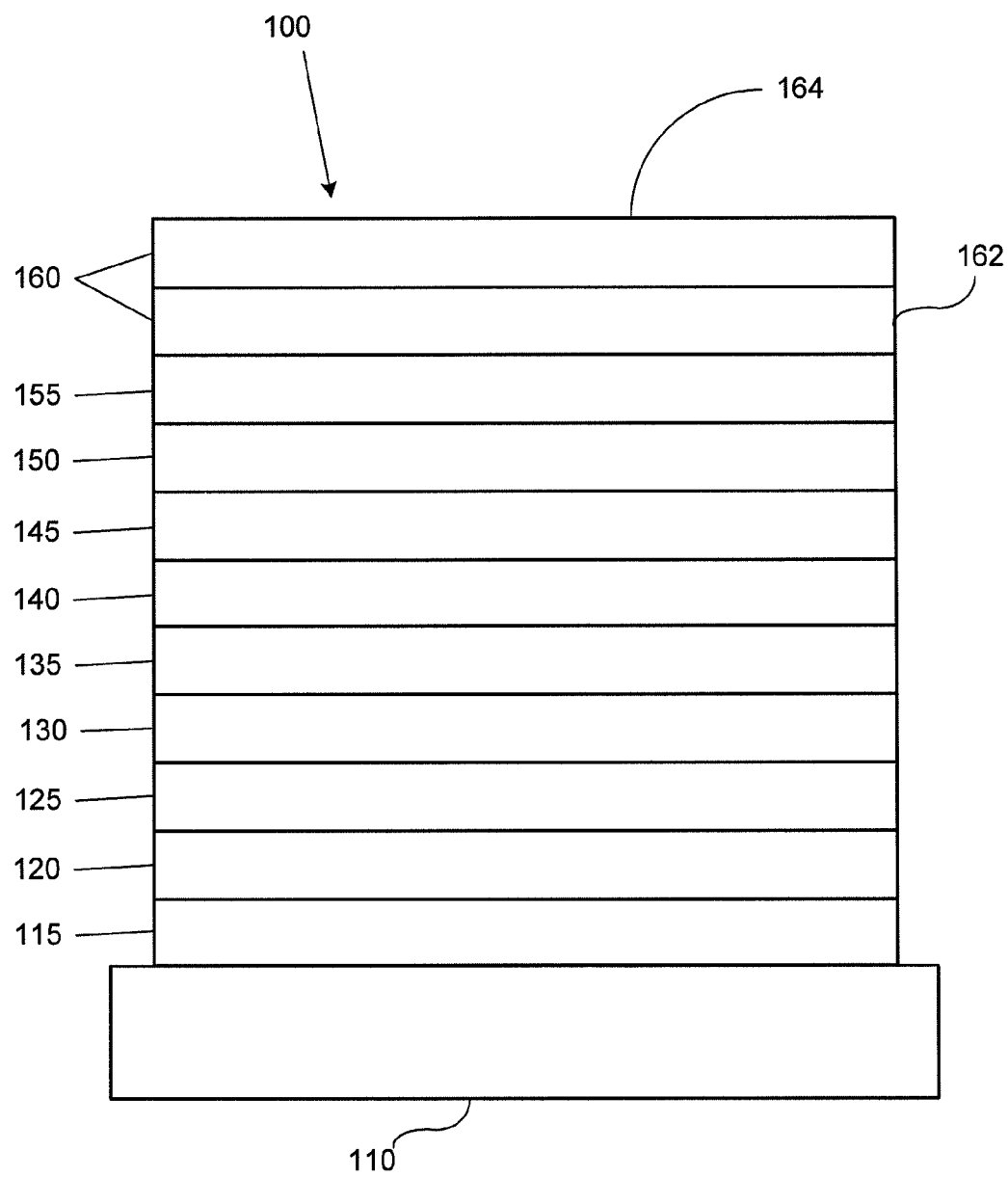
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
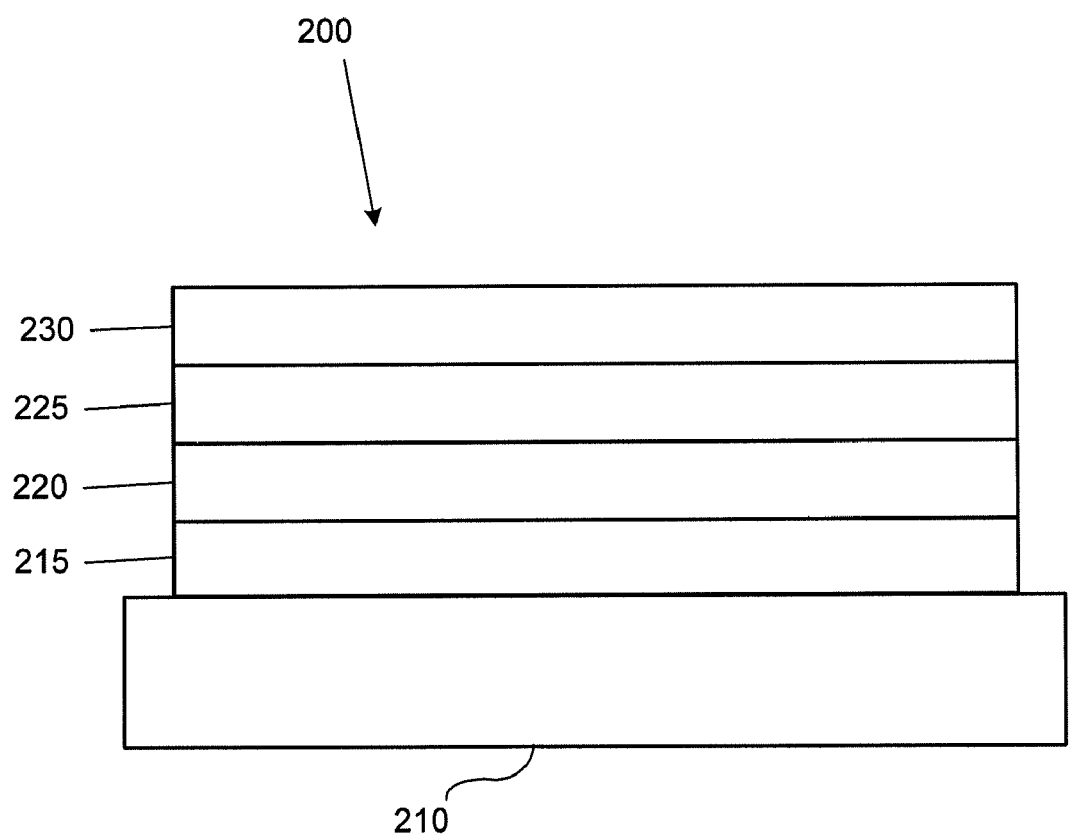
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

It is desirable to pattern devices with high resolution over a large surface area in order to make an OLED display. However, it may be difficult to obtain high resolution and large surface area at the same time. For example, using high resolution shadow masks to deposit organic materials may be difficult in connection with a large mother glass to manufacture OLED displays. Each layer that is patterned adds to the difficulty, due to extra manufacturing and alignment steps. In many processes, red, green and blue emissive layers (EMLs) are patterned using 3 shadow mask but fewer masks would be preferred to simplify manufacturing.

An organic light emitting device is provided. The device includes an anode, a cathode, and an organic emissive stack disposed between the anode and the cathode. The device may be a "pixel" in a display, capable of emitting a wide variety of colors through the use of independently addressable "subpixels," each subpixel emitting a different spectrum of light. In the most general sense, the device includes a first subpixel and a second subpixel, and at least one of the anode and the cathode has independently addressable first and second regions corresponding to the first and second subpixels. The device includes an emissive stack disposed between the anode and the cathode. The emissive stack includes a first organic emissive layer and a second organic emissive layer. The first organic emissive layer is disposed between the anode and the cathode, and extends throughout the first and second regions. The second organic emissive layer is disposed between the anode and the cathode, and extends throughout the second region but not the first region. The second organic emissive layer is disposed closer to the cathode than the first organic emissive layer. The first organic emissive layer is emissive in the first region, and the second organic emissive layer is emissive in the second region.

As used herein, the term "emissive stack" may refer to a layer having multiple sublayers, such as the first and second organic emissive layers referred to in the previous paragraph. The emissive stack may include other sublayers, such as non-emissive spacers. Not every sublayer of the emissive stack is necessarily emissive, and layers that are emissive may be emissive only in certain regions of the device.

Figure 3:
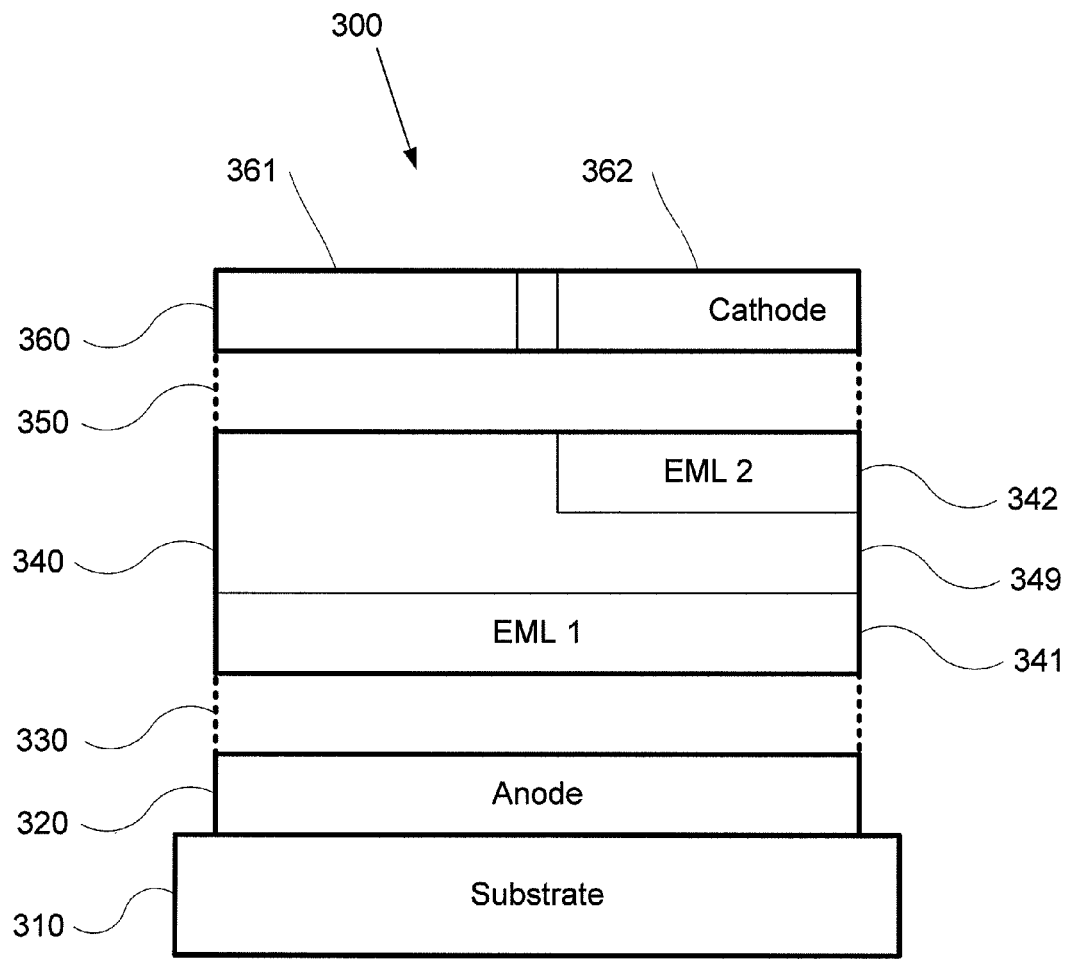
FIG. 3 shows a device having a first organic emissive layer that extends across first and second regions, and a second organic emissive layer extending only across a second region.

FIG. 3 shows an organic light emitting device 300 having an emissive stack 340 that includes a first organic emissive layer 341 that is emissive and that extends across multiple subpixels. Device 300 is disposed over a substrate 310. Device 300 includes an anode 320 and a cathode 360. As illustrated, cathode 360 has a first region 361 and a second region 362, which are independently addressable. Independently addressable regions could also be implemented through anode 320. Device 300 therefore has a first subpixel defined by the area of first region 361, and a second subpixel defined by the area of second region 362. Device 300 includes an emissive stack 340 disposed between anode 320 and cathode 330. The emissive stack includes a first organic emissive layer 341 (EML1) that extends throughout the first and second regions. First organic emissive layer 341 includes a first emissive material. The emissive stack includes a second organic emissive layer 342 (EML2) that extends throughout the second region but not the first region. Second organic emissive layer 342 includes a second emissive material. In general, "EML" refers to a layer that includes an emissive material that emits at least somewhere in the device. Emissive stack 340 as illustrated also includes an optional non-emissive organic spacer layer 349. Organic light emitting device may also include organic layers 330 between the emissive stack and the anode, and organic layers 350 between the emissive stack and the cathode. Organic layers 330 may be any layers suitable for use in an organic light emitting device between the anode and the emissive stack, including a hole injection layer, a hole transport layer, an electron blocking layer, and other layers. Organic layers 350 may be any layers suitable for use in an organic light emitting device between the cathode and the emissive stack, including an electron injection layer, an electron transport layer, a hole blocking layer, and other layers. Second organic emissive layer 342 emits in the second region 362. First organic emissive layer 341 emits in the first region 361. First organic emissive layer 341 may optionally emit in second region 362.

Each of devices 400 through 1000, illustrated in FIGS. 4 through 10, includes an anode, a cathode, an emissive stack, and organic layers corresponding to layers 330 and 350 of device 300. Specifically:

Device 400 is disposed over a substrate 410 and includes an anode 420, a cathode 460, and an emissive stack 440 disposed between the anode and the cathode. Device 400 may optionally include organic layers 430 and 450 corresponding to organic layers 330 and 350 of device 300.

Device 500 is disposed over a substrate 510 and includes an anode 520, a cathode 560, and an emissive stack 540 disposed between the anode and the cathode. Device 500 may optionally include organic layers 530 and 550 corresponding to organic layers 330 and 350 of device 300.

Device 600 is disposed over a substrate 610 and includes an anode 620, a cathode 660, and an emissive stack 640 disposed between the anode and the cathode. Device 600 may optionally include organic layers 630 and 650 corresponding to organic layers 330 and 350 of device 300.

Device 700 is disposed over a substrate 710 and includes an anode 720, a cathode 760, and an emissive stack 740 disposed between the anode and the cathode. Device 700 may optionally include organic layers 730 and 750 corresponding to organic layers 330 and 350 of device 300.

Device 800 is disposed over a substrate 810 and includes an anode 820, a cathode 860, and an emissive stack 840 disposed between the anode and the cathode. Device 800 may optionally include organic layers 830 and 850 corresponding to organic layers 330 and 350 of device 300.

Device 900 is disposed over a substrate 910 and includes an anode 920, a cathode 960, and an emissive stack 940 disposed between the anode and the cathode. Device 900 may optionally include organic layers 930 and 950 corresponding to organic layers 330 and 350 of device 300.

Device 1000 is disposed over a substrate 1010 and includes an anode 1020, a cathode 1060, and an emissive stack 1040 disposed between the anode and the cathode. Device 1000 may optionally include organic layers 1030 and 1050 corresponding to organic layers 330 and 350 of device 300.

Device 1100 is disposed over a substrate 1110 and includes an anode 1120, a cathode 1160, and an emissive stack 1140 disposed between the anode and the cathode. Device 1100 may optionally include organic layers 1130 and 1150 corresponding to organic layers 330 and 350 of device 300.

Each of devices 400 through 1100 is a variation on device 300 of FIG. 3. A common feature between all of the devices is that there is a first organic emissive layer, labeled EML1 (analogous to first organic emissive layer 341), that extends across a first and second region (analogous to regions 361 and 362), and a second organic emissive layer, labeled EML2 (analogous to second organic emissive layer 342), that extends across a second region but not a first region, and the second organic emissive layer is closer to the cathode than the first organic emissive layer. Some differences between the devices are that they may or may not include additional subpixels with independently addressable regions, and additional emissive layers that may cover a variety of regions in the device, and may have various locations relative to the other emissive layers, the anode and the cathode.

Figure 4:
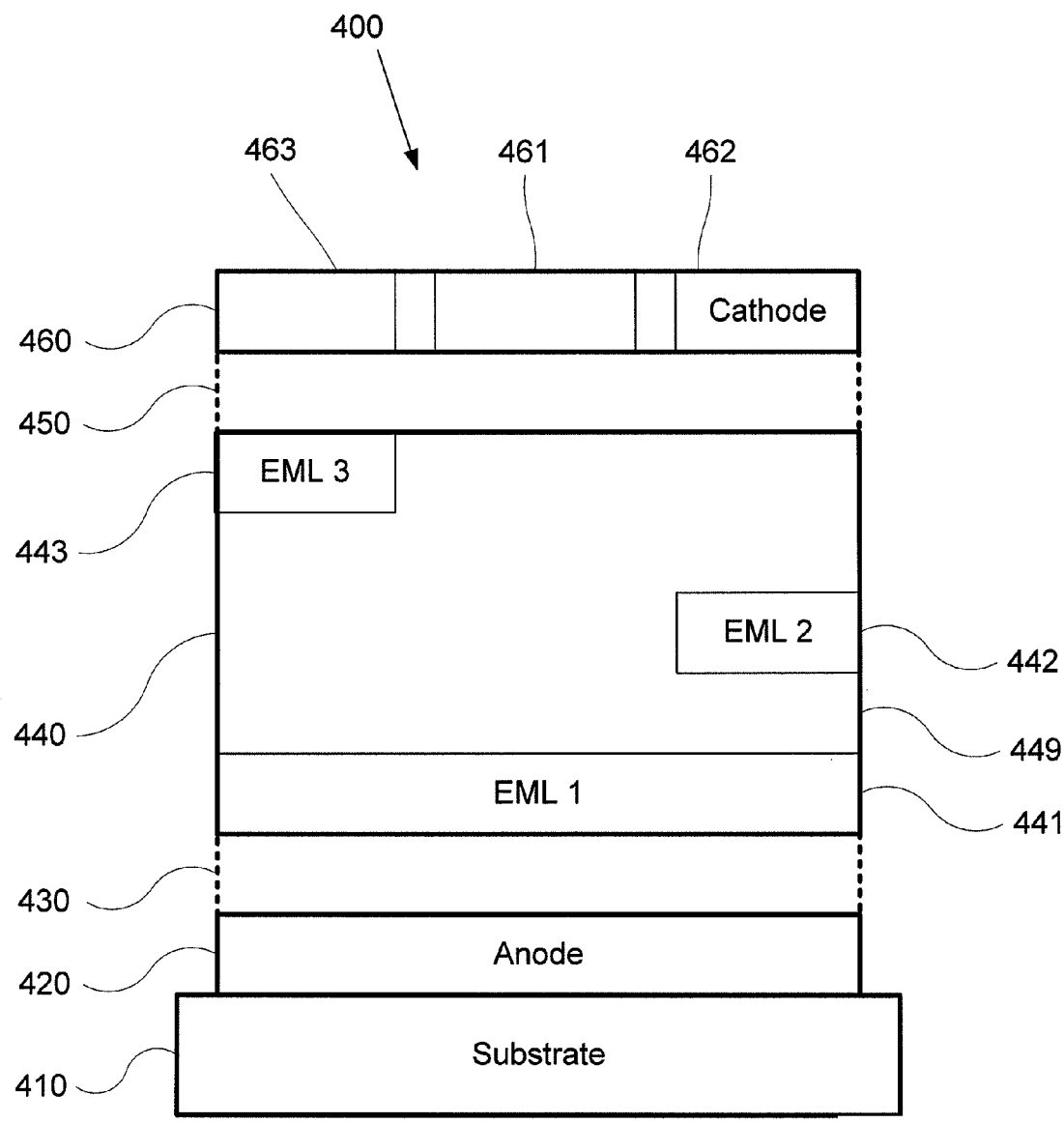
FIG. 4 shows a device similar to that of FIG. 3, but adding a third region and a third organic emissive layer extending only across the third region.

FIG. 4 shows device 400, which illustrates a device having three subpixels, corresponding to first region 461, second region 462 and third region 463. The third subpixel may emit a different spectrum of light from the first and second subpixels. In device 400, first organic emissive layer 441 extends throughout the first, second and third regions 461, 462 and 463. Second organic emissive layer 442 extends throughout second region 462, but not first region 461 and third region 463. Third organic emissive layer 443 extends throughout third region 463, but not first region 461 and second region 462. Third organic emissive layer 443 includes an emissive material. As illustrated in FIG. 4, third organic emissive layer 443 is closer to the cathode than first and second organic emissive layers 441 and 442. A non-emissive organic spacer layer 449 separates first, second and third organic emissive layers 441, 442 and 443.

Figure 5:
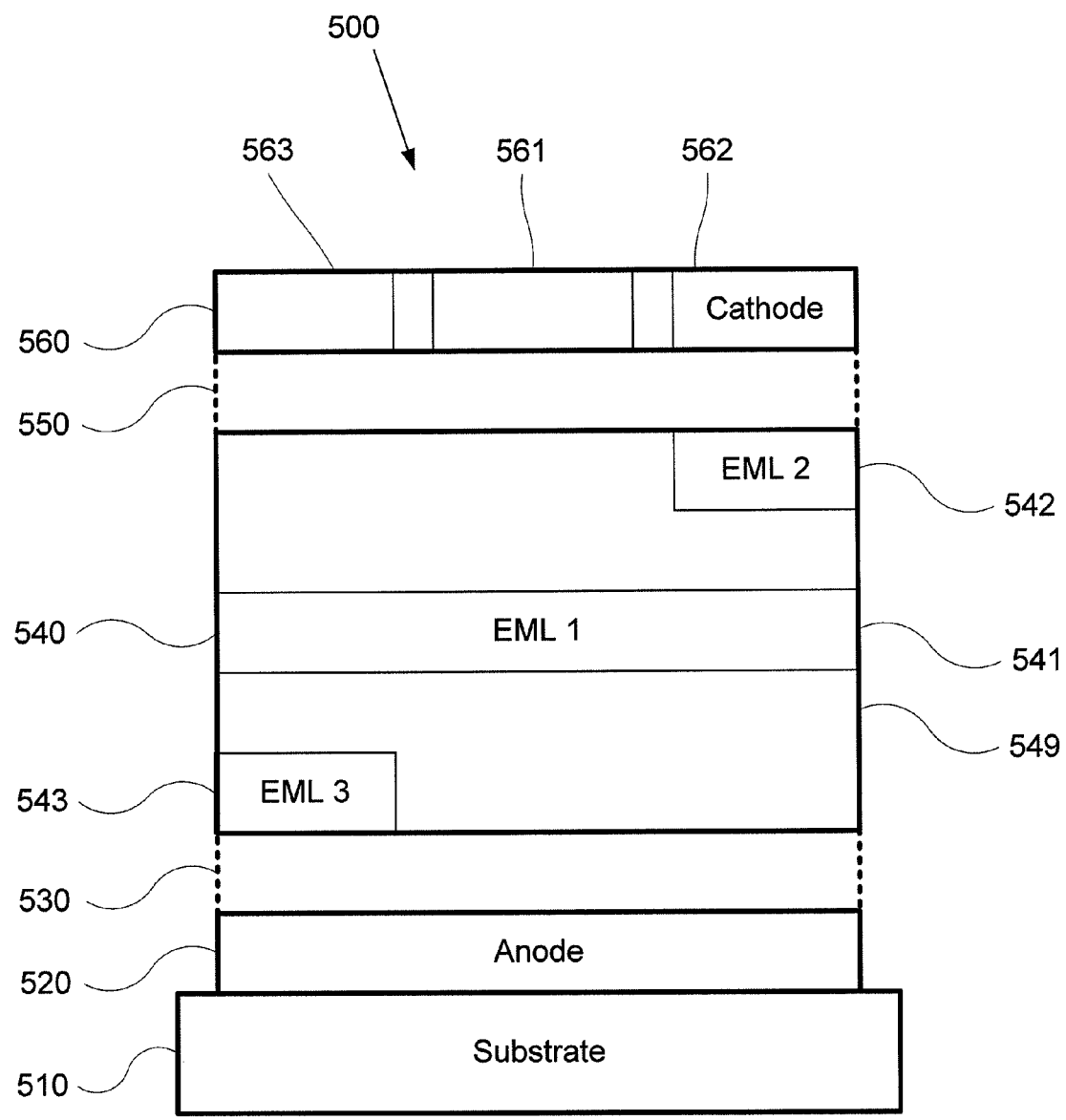
FIG. 5 shows a device similar to that of FIG. 4, but changing the position of the third organic layer relative to the anode and the first organic layer.

FIG. 5 shows device 500, which illustrates a device having a third organic emissive layer 543 disposed closer to anode 520 than first organic emissive layer 541. Device 500 is otherwise analogous to device 400, having an emissive stack 540 that includes a first organic emissive layer 541, a second organic emissive layer 542, a third organic emissive layer 543, and a non-emissive organic spacer layer 549, as well as regions 561, 562 and 563, analogous to the similarly named parts of device 400, with the exception of the placement of third organic emissive layer 543.

Figure 6:
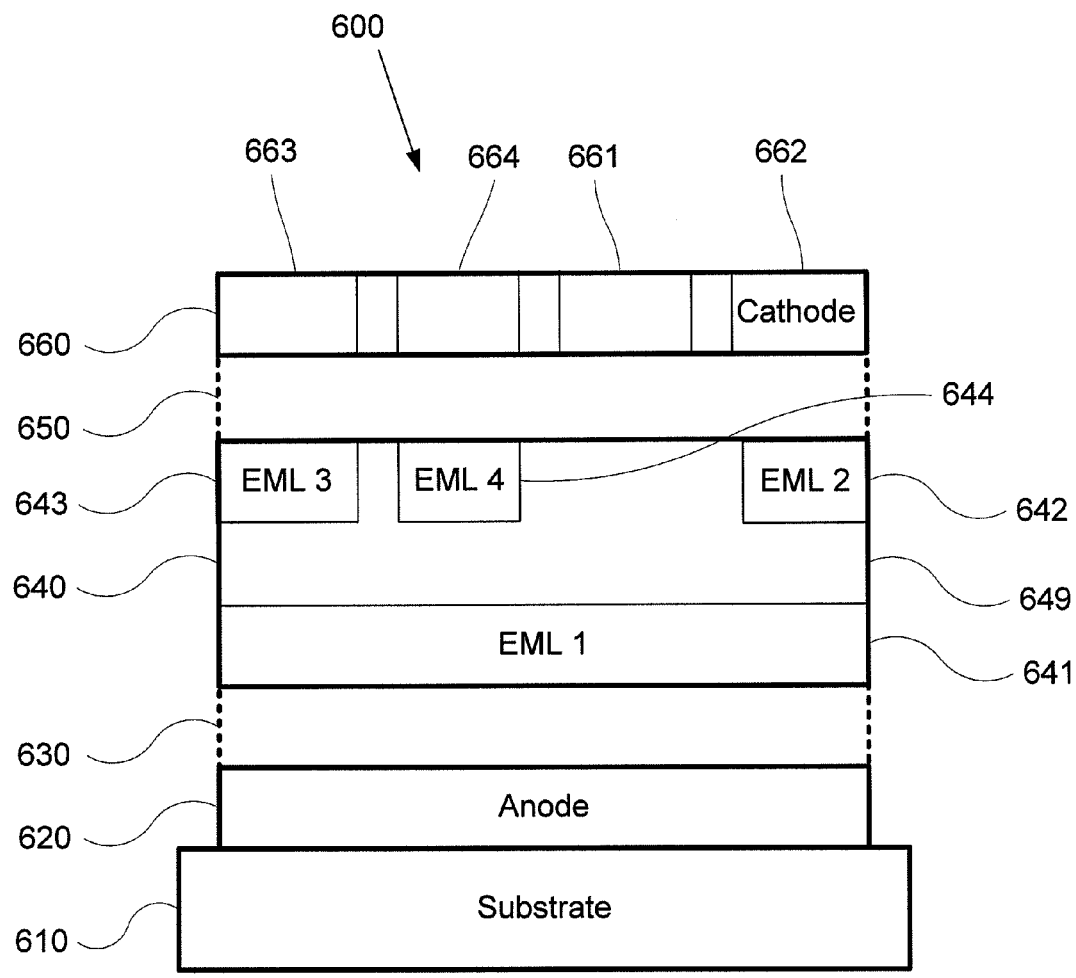
FIG. 6 shows a device similar to that of FIG. 4, but adding a fourth region and a fourth organic emissive layer extending only across the fourth region.

FIG. 6 shows device 600, which illustrates a device having four subpixels, corresponding to first region 661, second region 662, third region 663 and fourth region 664. Each of the subpixels may emit a different spectrum of light. In device 600, first organic emissive layer 641 extends throughout the first, second, third and fourth regions 661, 662, 663 and 664. Second organic emissive layer 642 extends throughout second region 662, but not first region 661, third region 663, and fourth region 644. Third organic emissive layer 643 extends throughout third region 663, but not first region 661, second region 662, and fourth region 644. Fourth organic emissive layer 644 extends throughout fourth region 664, but not first region 661, second region 662, and third region 663. In FIG. 6, each of second, third and fourth organic emissive layers 642, 643 and 644 is closer to the cathode than first organic emissive layer 641.

Figure 7:
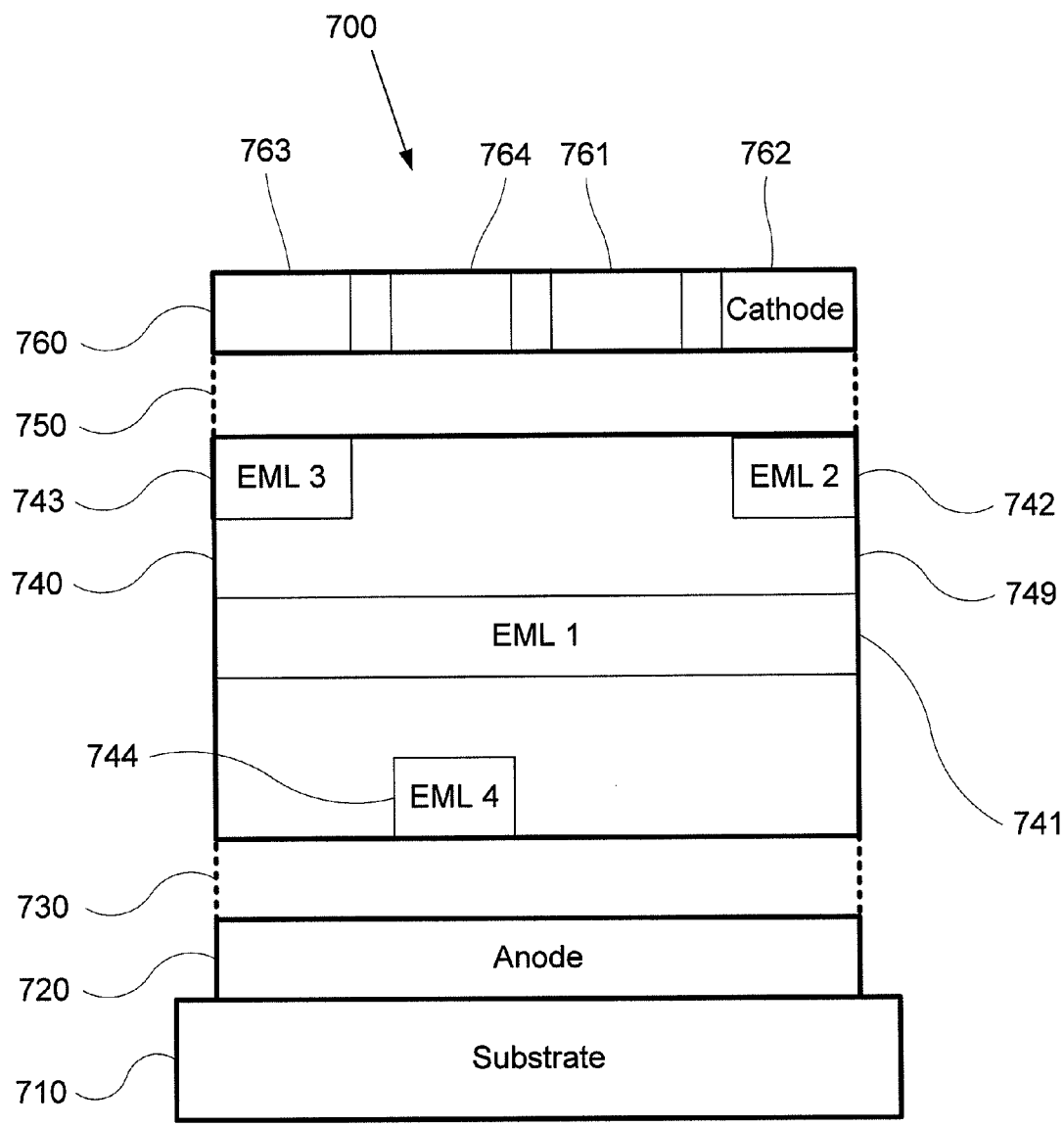
FIG. 7 shows a device similar to that of FIG. 6, but changing the position of the fourth organic layer relative to the anode and the first organic layer.

FIG. 7 shows device 700, which illustrates a device having a fourth organic emissive layer 744 disposed closer to anode 720 than first organic emissive layer 741. Device 700 is otherwise analogous to device 600, having an emissive stack 740 that includes a first organic emissive layer 741, a second organic emissive layer 742, a third organic emissive layer 743, a fourth organic emissive layer 744, and a non-emissive organic spacer layer 749, as well as regions 761, 762, 763 and 764, analogous to the similarly named parts of device 700, with the exception of the placement of fourth organic emissive layer 744.

Figure 8:
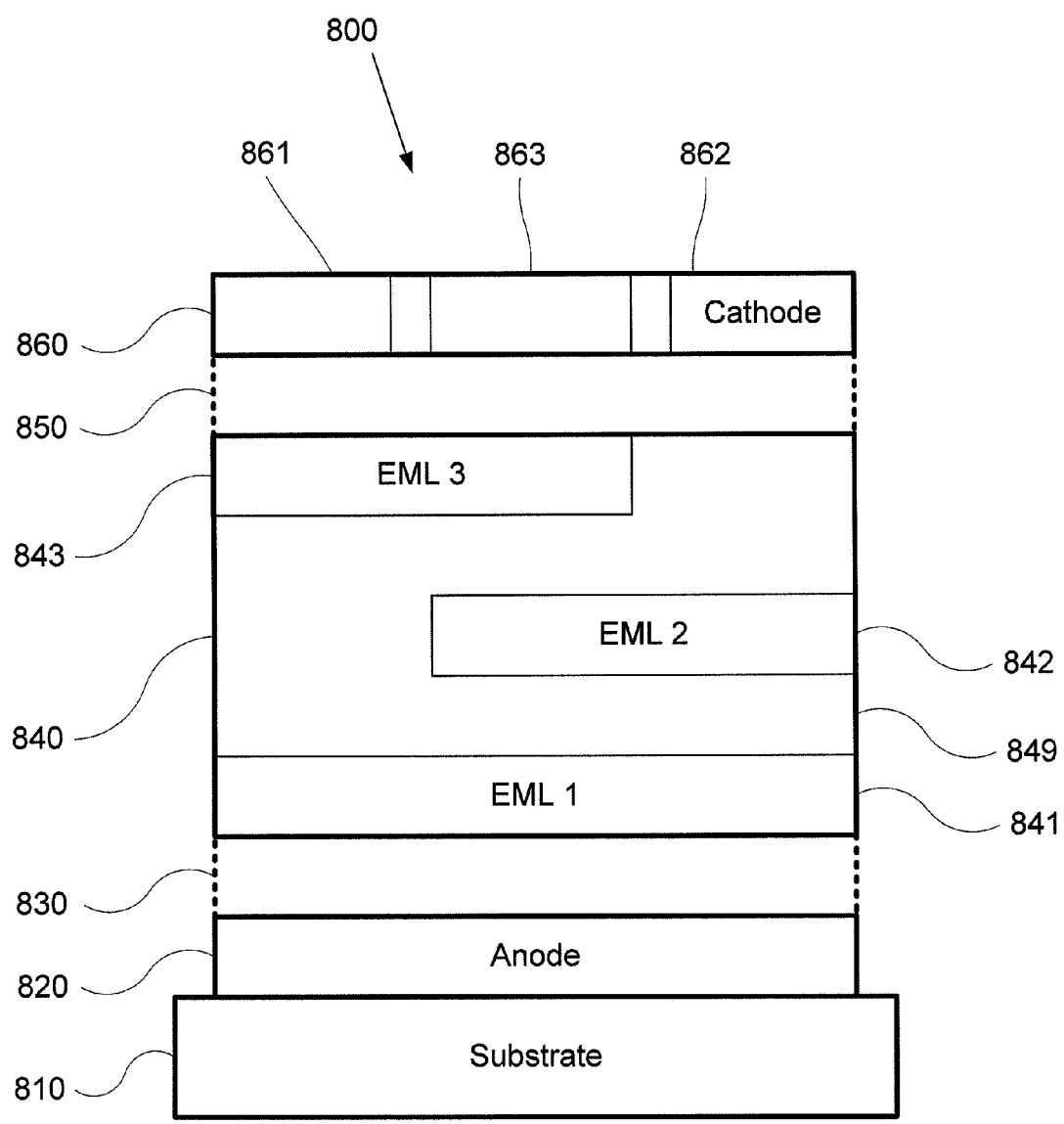
FIG. 8 a device similar to that of FIG. 4, but illustrating that the second and third organic layers are not necessarily confined to just the second and third regions, respectively.

FIG. 8 shows device 800, which illustrates a device having second and third organic emissive layers 842 and 843 that extend throughout more than one, but not all, regions of the device. Device 800 is otherwise analogous to device 400, having an emissive stack 840 that includes a first organic emissive layer 841, a second organic emissive layer 842, a third organic emissive layer 843, and a non-emissive organic spacer layer 849, as well as regions 861, 862 and 863, analogous to the similarly named parts of device 400, with the exception of the coverage of second and third organic emissive layers 842 and 843.

Figure 9:
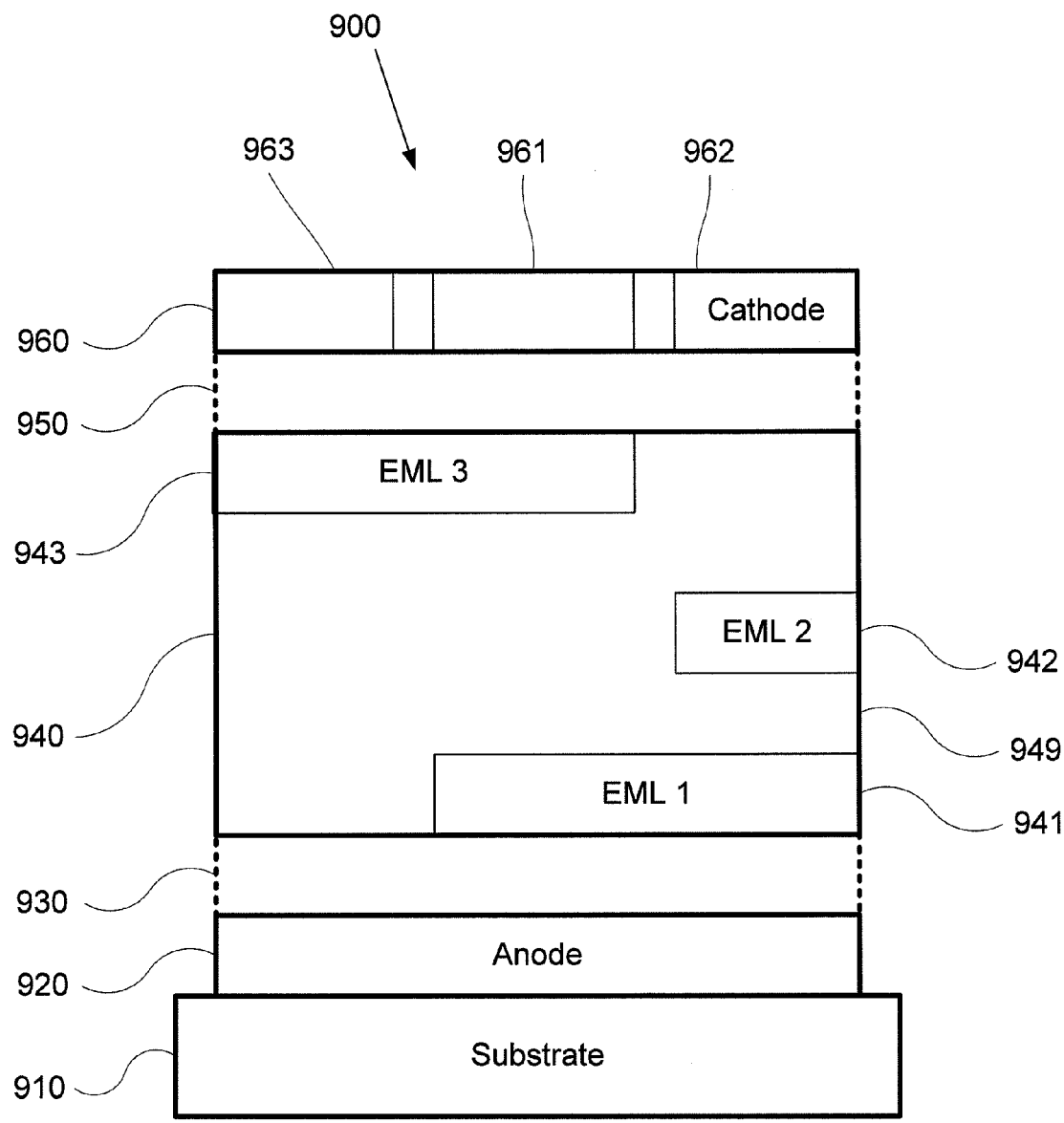
FIG. 9 shows a device similar to that of FIG. 4, but illustrating that the third organic layers is not necessarily confined to just the third region, and that the first organic emissive layer may have patterning within a pixel.

FIG. 9 shows device 900, which illustrates a device having a first organic emissive layer 941 that extends throughout first and second regions 961 and 962, but not third region 963. In addition, third organic emissive layer 943 extends throughout more than one, but not all, regions of the device. Device 900 is otherwise analogous to device 400, having an emissive stack 940 that includes a first organic emissive layer 941, a second organic emissive layer 942, a third organic emissive layer 943, and a non-emissive organic spacer layer 949, as well as regions 961, 962 and 963, analogous to the similarly named parts of device 400, with the exception of the coverage of the first and third organic emissive layers 941 and 943.

Figure 10:
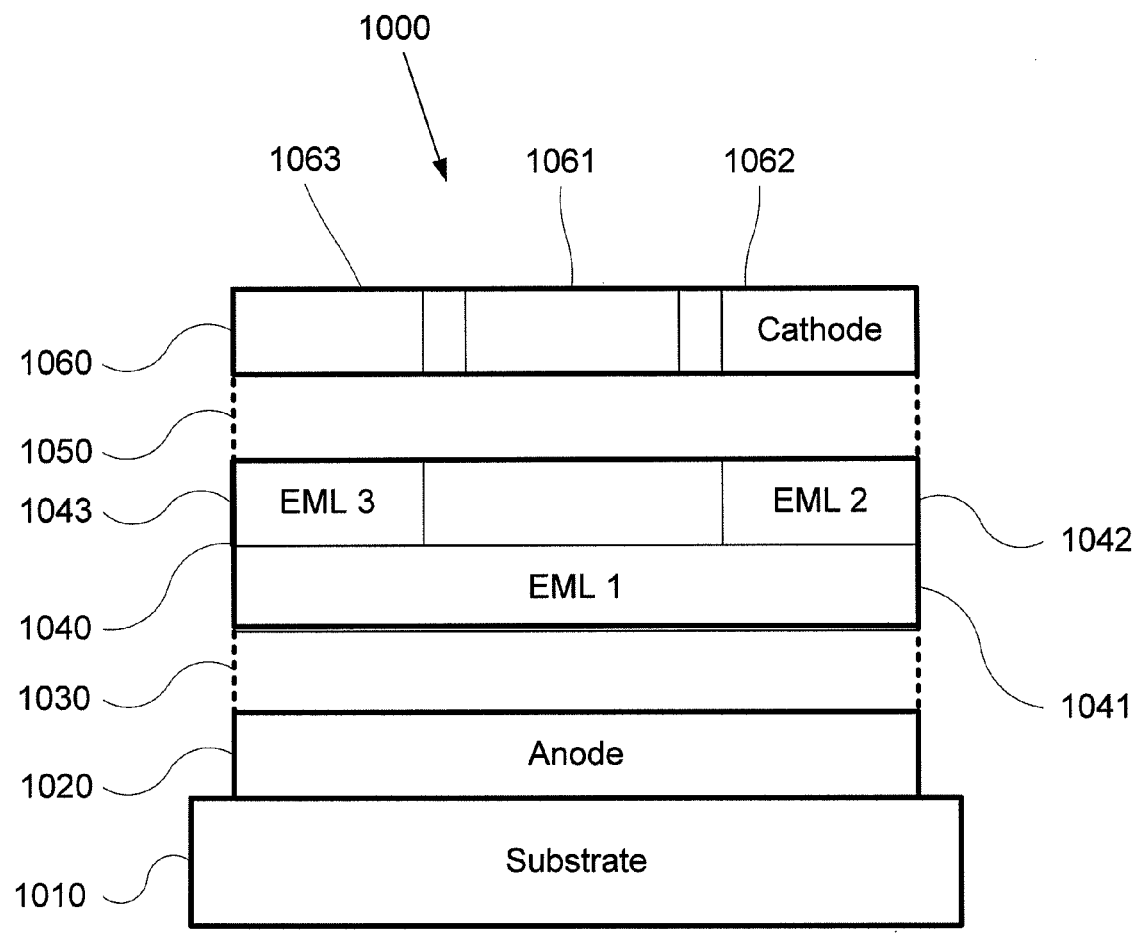
FIG. 10 shows a device similar to that of FIG. 4, but illustrating that a non-emissive spacer layer is not necessarily present.

FIG. 10 shows device 1000, which illustrates a device without a non-emissive organic spacer layer. Device 1000 is otherwise similar to device 400, and includes first, second and third regions 1061, 1062 and 1063, as well as first, second and third organic emissive layers 1041, 1042 and 1043, and non-emissive organic spacer layer 1049. Layer 1050 may be in contact with first organic emissive layer 1041, although the illustration shows an empty space.

Figure 11:
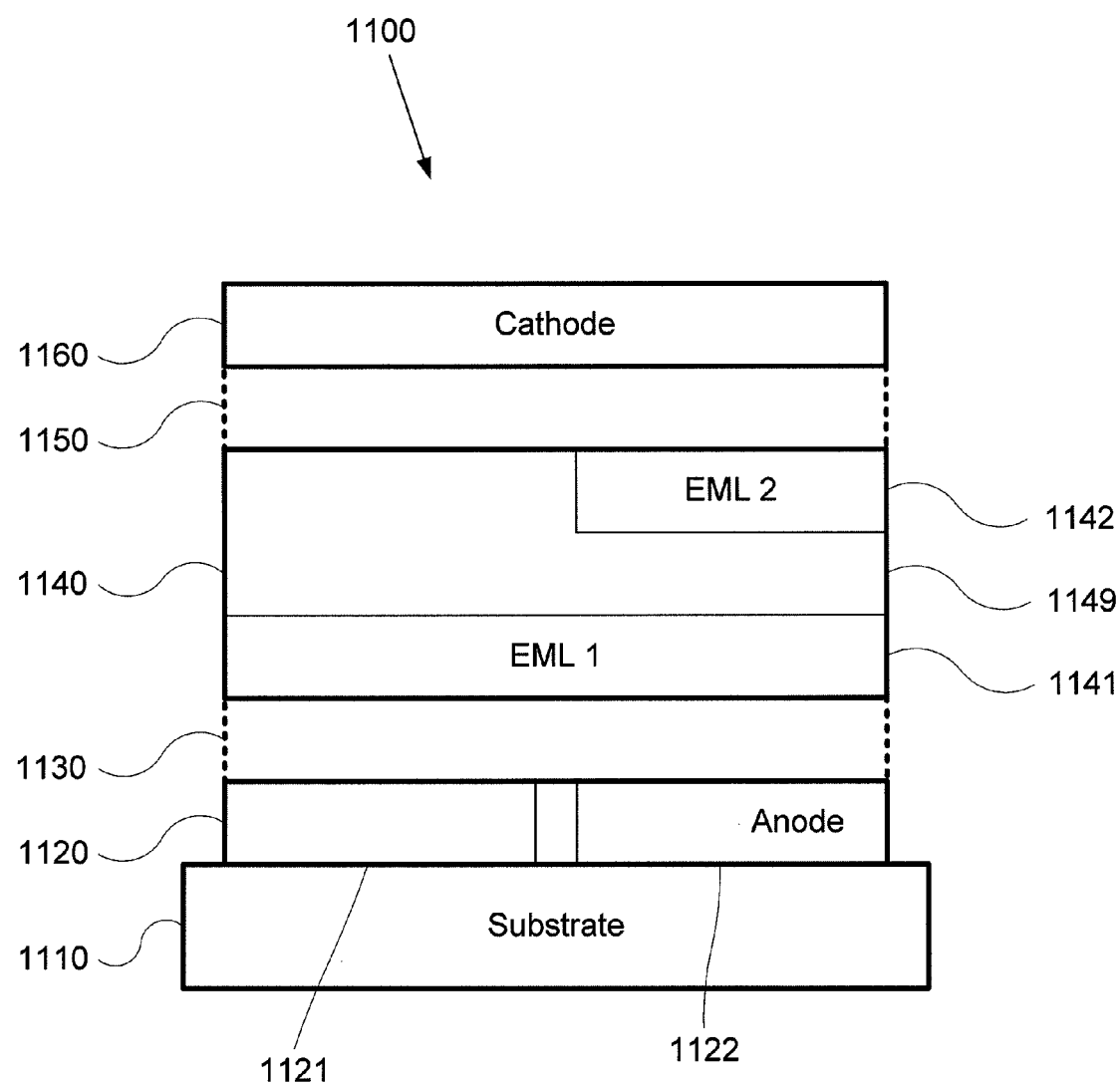
FIG. 11 shows a device similar to that of FIG. 4, but illustrating that the anode may have independently addressable regions.

FIG. 11 shows device 1100, which illustrates a device having first and second regions 1121 and 1122 that are independently addressable via anode 1120, instead of the cathode as they are in devices 300 through 1000. Device 1100 is otherwise similar to device 300, and includes first and second organic emissive layers 1141 and 1142, and non-emissive organic spacer layer 1149. A wide variety of other configurations having regions that are independently addressable through an anode may also be used. The anode may be further from the substrate than the cathode, as illustrated in FIG. 2.

As illustrated in the various figures, there are a wide variety of device configurations that include a first organic emissive layer disposed between the anode and the cathode, and extending throughout first and second regions, and a second organic emissive layer disposed between the anode and the cathode, and extending throughout the second region but not the first region, where the second organic emissive layer is disposed closer to the cathode than the first organic emissive layer. Additional regions, corresponding to additional subpixels, may be added as illustrated in FIGS. 4 through 10, including 3, 4 or more total subpixels. Additional organic emissive layers that include emissive materials may be included, in a variety of positions relative to the first and second organic emissive layers. Where there are additional regions, these additional organic emissive layers, as well as the first and second organic emissive layers, may extend throughout the regions in a number of different ways. Non-emissive organic spacers may or may not be incorporated into the emissive stack in a variety of ways. The various features described herein may be combined in various permutations that may not be specifically illustrated in the Figures.

Each of the first, second, and possibly additional organic emissive layers of the emissive stack, with the exception of any non-emissive organic spacer, emits light in at least one region of the device, but not necessarily in every region of the device where the organic emissive layer is present. For example, in device 3, first organic emissive layer 341 may emit light in region 361 but not region 362. In this case, first organic emissive layer serves as a hole transport layer, hole injection layer, spacer, electron blocking layer, or the like in region 362. Or, first organic emissive layer 341 may emit light in both regions 361 and 362. In this situation, emissive layer 342 will emit light in the only region where it is present, region 362. As a result, the device will have two sub-pixels, each emitting a different spectrum of light. The subpixel corresponding to region 361 will have light emitted by first organic emissive layer 341, and the subpixel corresponding to region 362 will have light that is a combination of the spectra emitted by first and second organic emissive layers 341 and 342.

Whether a particular emissive layer emits light in a particular region of the device may be controlled via a number of factors. The charge transport and charge transfer characteristics of the different regions may be controlled, most preferably through material selections and material concentrations of the emissive layers.

Optical characteristics, such as device thickness and the properties of the electrodes or other layers may be controlled to take advantage of microcavity effects to suppress or allow selected emission. The use of microcavities in this way is known, and is described in Dodabalapur et al., *Physics and applications of organic microcavity light emitting diodes*, J. Appl. Phys. 80 (12), 15 Dec. 1996, pages 6954-64. Optical characteristics may be selected for the device as a whole, or may be selected for individual subpixels, either via patterning of the organic emissive layers, for example by using a thick organic emissive layer or a thin organic emissive layer to adjust cavity size, or via patterning of other organic layers or electrodes.

Non-emissive spacers in the emissive stack may be used to take advantage of microcavity effects. For example, FIG. 6 shows second, third and fourth organic emissive layers 642, 643 and 644 disposed at the same distance from the anode and the cathode, whereas FIG. 4 shows second organic emissive layer 442 disposed closer to the anode than third emissive layer 443. Such spacing may advantageously be controlled without additional masking steps, i.e., the non-emissive spacer layer is not necessarily patterned, and may be deposited (or not) in between the deposition of the various organic emissive layers.

The use of phosphorescent emitters is preferred, particularly for the first organic emissive layer 341. In many organic devices, phosphorescent materials are effective hole transport materials, but may not be effective electron transport materials. Thus, phosphorescent emissive materials may be particularly effective in devices having a first organic emissive layer that extends throughout the entire pixel that is disposed closer to the anode than any other emissive layers, and where every other emissive layer is confined to a single region of the device. Examples of such devices include devices 300, 400, 600, 1000 and 1100. If each organic emissive layer emits light only in the region where it is closest to the cathode, and considering charge transport, both electrons and holes may reach every organic emissive layer. Holes may readily reach every emissive layer. The first organic emissive layer is effective at transporting holes, so even though it is disposed between the anode and the other emissive layers, it may not block holes from reaching the other emissive layers. Electrons may also readily reach every emissive layer. Every emissive layer is, at least in one region, the closest emissive layer to the cathode. Thus, even if the emissive layers are not effective at transporting electrons, every emissive layer has exposure to the cathode unblocked by any other emissive layer. The first organic emissive layer is the closest organic emissive layer to the cathode in the first region of these devices.

For device configurations other than those described in the preceding paragraph, it may be desirable to use at least some emissive layers having good ambipolar transport characteristics.

While phosphorescent emissive materials are preferred in many situations, fluorescent emissive materials may also be used.

The use of a first organic emissive layer that is not patterned within a pixel, such as a "blanket" layer, is particularly desirable, because the use of an unpatterned layer allows for n+1 subpixels that emit different spectra, while requiring the deposition of only n patterned organic emissive layers. Thus, a device having three subpixels, such as the red, green and blue subpixels of a full-color display, may be fabricated with only two masking steps. However, a patterned first organic emissive layer may be used, as illustrated, for example, in FIG. 10.

While many of the examples illustrate devices in cross-section showing every subpixel for ease of illustration, suggesting that the subpixels are rectangles that extend across the entire pixel, other configurations may be used. For example, in a device having four subpixels, the regions corresponding to the subpixels may be four rectangles arranged in a two-by-two array. A wide variety of other geometries may be used.

Material Sets

As used herein, Compounds A through E are as follows:

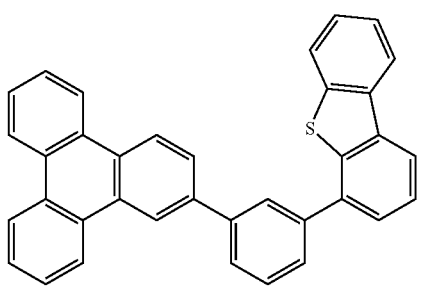
Compound A

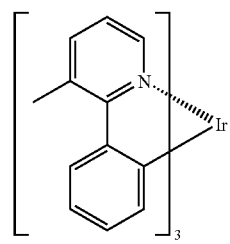
Compound B

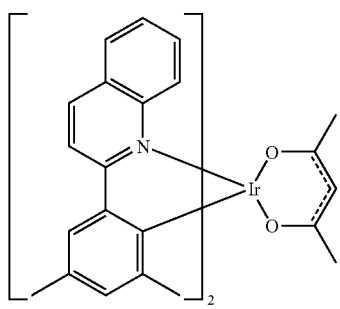
Compound C

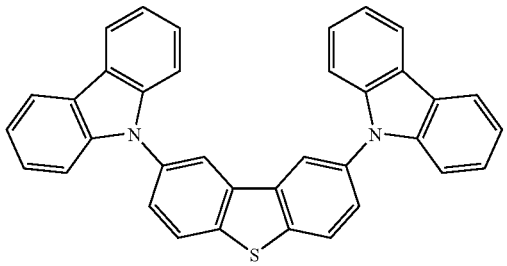
Compound D

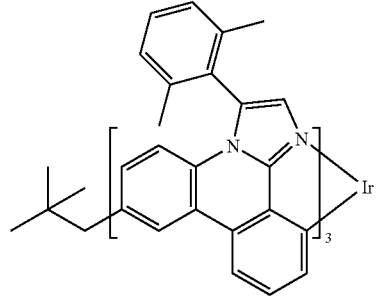
Compound E

The emissive stack of a device as described herein includes multiple organic emissive layers, each of which emits in at least one region of the device. An organic emissive layer does not necessarily emit in every region. Generally, each region includes at least one organic emissive layer that does emit in that region, and may or may not include other organic emissive layers which may or may not emit.

A preferred configuration for an RGB display includes a blanket first organic emissive layer, so that the number of high resolution patterning steps may be reduced, and it is preferred that most or all of the emission in a particular region come from a single emissive layer, so that the colors may be more saturated. Devices 300, 400, 500, 600, 700 1000 and 1100 meet these criteria. In an actual RGB display, there would also be at least three subpixels per device, one for each color. In this situation, the first organic emissive layer emits light only in the first region, where it is the only organic emissive layer present. In the other regions, it transports either electrons or holes, depending on whether it is closer to the cathode or the anode, respectively, than the organic emissive layer in the region in question that actually emits light. For example, in device 400, first organic emissive layer 441 emits light in first region 461, and transports holes in second and third regions 462 and 463 to second and third organic emissive layers 442 and 443, which emit light in the regions where they are present. So, in device 400, it is preferred that first organic emissive layer 441 have good hole transport characteristics. In device 500, first organic emissive layer 541 emits light in first region 561, transports holes in second region 562 to second emissive layer 542, and transports electrons in third region 563 to third organic emissive layer 543, such that second and third organic emissive layers 542 and 543 emit light in the regions where they are present. So, in device 500, it is preferred that first organic layer 541 have good hole and electron (ambipolar) transport characteristics.

More generally, the organic emissive layer or layers that emit in a particular region may be selected via material selection, even where the criteria for the preferred RGB configuration are relaxed. It is preferred that a layer through which holes pass to reach a layer that emits have good hole transport characteristics, that a layer through which electrons pass to reach a layer that emits have good electron transport characteristics, and a layer through which both holes and electrons pass to reach a layer that emits (perhaps in different regions, as explained above for device 500) have ambipolar transport characteristics.

An example of an organic emissive layer that emits green light with good hole transport properties consists of Compound A doped with Compound B, a green phosphorescent emitter. The doping concentration may be between 1-50%. This is an example, and one of skill in the art could readily select many other suitable examples. Such a layer would be suitable for use, for example, as the first organic emissive layer in devices 300, 400, 600, 800, 900, 1000 and 1100, for emitting green light in the first region of each of those devices, and transporting holes but not emitting light in the other regions of those devices. Such a layer may not be as well suited for use as the first organic layer of devices 500 and 700, where a first organic emissive layer having ambipolar transport characteristics may be more desirable. More generally, the use in an emissive layer as the emitter of almost any green-emitting phosphorescent Iridium(III) complex, for which several examples are provided in Table 1, would be expected to result in an emissive layer with good hole transport properties. It is preferred that the concentration of the green phosphorescent emitter be 15 to 50 wt % to achieve good hole transport properties, although other concentrations may be used.

An example of an organic emissive layer that emits red light with good hole transport properties consists of Compound A doped with Compounds B and C. C is a red phosphorescent emitter. The concentration of B may be between 1-50% and the concentration of C may be between 0.1 and 12%. More generally, almost any green-emitting phosphorescent Iridium(III) complex, for which several examples are provided in Table 1, can be used to transport holes but not emit light in an emissive layer that emits red light. When both a green phosphorescent emissive material and a red phosphorescent material are present in the appropriate concentrations, energy may transfer to the red phosphorescent material for emission. Preferred concentrations are 15 to 50 wt % for the green phosphorescent material and 0.1 to 12 wt % for the red phosphorescent material, although other concentrations may be used. Also more generally, most of the red phosphorescent materials disclosed in Table 1 are expected to work in such a device. Other concentrations may be used. Other material selections may also be used, such as a red emissive molecule that emits red light and also transports holes. The red-emitting Ir(III) organometallic complexes disclosed in Table 1 are examples of preferred materials use as molecules that both emit light and transport holes.

An example of an organic emissive layer that emits blue light without as much concern for hole transport or electron transport characteristics consists of Compound D doped with Compound E. The concentration of Compound E ranges from 1-30%. Such a layer is suitable for use, for example, as the second organic emissive layer of devices 300, 400, 500, 600, 700, 900, 1000 and 1100, for use on devices where the second region emits only blue light. The hole and electron transport characteristics of the blue emissive layer are of less concern in such devices, because the layer is present only in the second region of the device. Because it is the only emissive layer in the second region, there is no need for electrons or holes to completely traverse the second organic emissive layer.

While blue emission is needed for an RGB display, there are many issues with blue emissive materials, including difficulty in achieving material sets that emit saturated blue with high efficiency and lifetime. These factors may limit the materials, including dopants as well as hosts, that may be used for blue emissive layers. For some applications, it may be preferred to minimize the presence of blue emitters in the device, and in particular, to avoid their use in layers that extend across multiple regions of the device, such as the first organic emissive layer. A first emissive layer that emits green light, i.e., light having a peak wavelength in the visible spectrum of 600 to 700 nm, is preferred for layers that extend across multiple regions of the device, such as the first organic emissive layer, because a much wider selection of materials having readily controllable hole and electron transport characteristics, without stability issues, is available. However, it is possible to use a blue emissive layer as the first organic emissive layer. More specifically, the many of the more stable and longer lived blue phosphorescent emitters currently known are imidazole and imidazophenanthridine materials. Many of these materials trap holes, and may not be good hole transporters. However, there are other blue phosphorescent emitters, such as phenylpyridine blue emitters, that are better hole transporters that would be suitable for use in a blanket blue-emitting layer, using, for example, an amylcarbazole host. However, these materials may also have lower stability.

More generally, for an organic emissive layer that is the only layer that emits in a particular region, i.e., where any other organic emissive layers are emissive only in other regions of the device, there is a great deal of latitude available in material selection, and material selection known to work in other devices in a more general context are good candidates. In addition, for layers that are not a part of the emissive stack, a wide variety of known materials and device configurations may be used. Many such materials are described in Table 1.

Suitable hosts for use in a blanket layer or layer that transports but does not emit in at least one region of a device include arylcarbazoles, aza-dibenzothiophene, aza-dibenzofuran, dibenzothiophene, dibenzofurans. The aza-type hosts can increase electron transportability of an emissive layer.

Examples of organic emissive layers with ambipolar transport characteristics include CBP doped with Compound B, or C or E, for green red or blue emission, respectively.

While the specific emissive materials provided as examples in the material sets above are phosphorescent, fluorescent materials may also be used.

More generally, layers including a phosphorescent dopant, whether as an emissive material or as a transport material in addition to another material that is emissive, are good candidates for good hole transport properties. Layers including hosts known to have good electron transport properties, such as CBP, are good candidates for good electron transport properties. Layers including both a phosphorescent dopant and a host known to have good electron transport properties are good candidates for ambipolar transport properties.

The position in a device where recombination and emission occurs, and whether such emission occurs, may be affected by a variety of factors, including microcavity effects, material selection, material concentrations, layer thicknesses. Charge transport may be affected by bulk properties within a layer, as well as factors at interfaces between layers. Charge balance may be considered as a whole—sometimes it is desirable to speed the progress of holes from the anode to the emitting layer, and sometimes it is desirable to slow them, depending on electron flow. These factors may be manipulated, in combination with the patterning of the emissive stack as disclosed herein, to achieve emission from the desired emissive organic layer or layers in each region.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

In addition to and/or in combination with the materials disclosed herein, many hole injection materials, hole transporting materials, host materials, dopant materials, exiton/hole blocking layer materials, electron transporting and electron injecting materials may be used in an OLED. Non-limiting examples of the materials that may be used in an OLED in combination with materials disclosed herein are listed in Table 1 below. Table 1 lists non-limiting classes of materials, non-limiting examples of compounds for each class, and references that disclose the materials.

TABLE 1

| MATERIAL | EXAMPLES OF MATERIAL | PUBLICATIONS |
|---|---|---|
| | Hole injection materials | |
| Phthalocyanine and porphryin compounds | (Cu phthalocyanine structure) | Appl. Phys. Lett. 69, 2160 (1996) |
| Starburst triarylamines | (starburst triarylamine structure) | J. Lumin. 72-74, 985 (1997) |
| $CF_x$ Fluorohydrocarbon polymer | $-[CH_xF_y]_n-$ | Appl. Phys. Lett. 78, 673 (2001) |

TABLE 1-continued
| Conducting polymers (e.g., PEDOT:PSS, polyaniline, polypthiophene) | 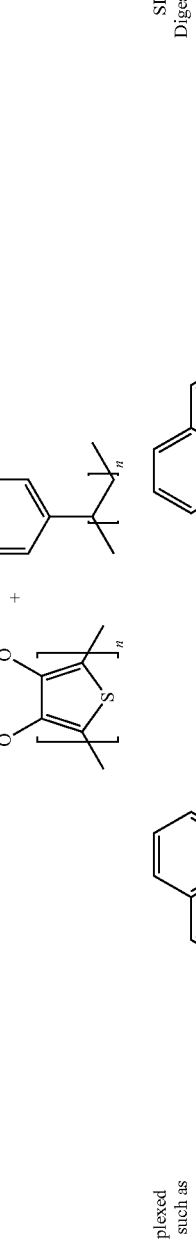 | Synth. Met. 87, 171 (1997) |
| --- | --- | --- |
| Arylamines complexed with metal oxides such as molybdenum and tungsten oxides | | SID Symposium Digest, 37, 923 (2006) |
| Hole transporting materials | | |
| Triarylamines (e.g., TPD, α-NPD) | 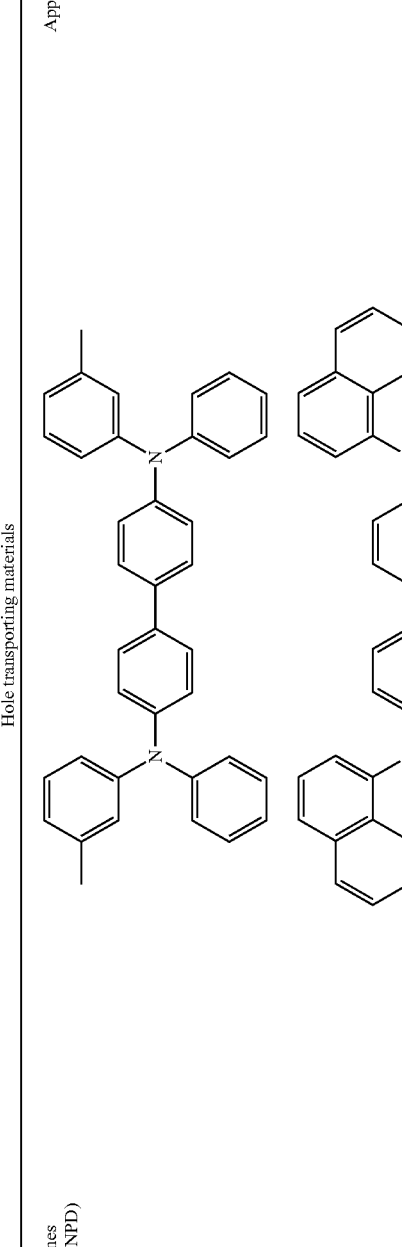 | Appl. Phys. Lett. 51, 913 (1987) US5061569 |

TABLE 1-continued
EP650955
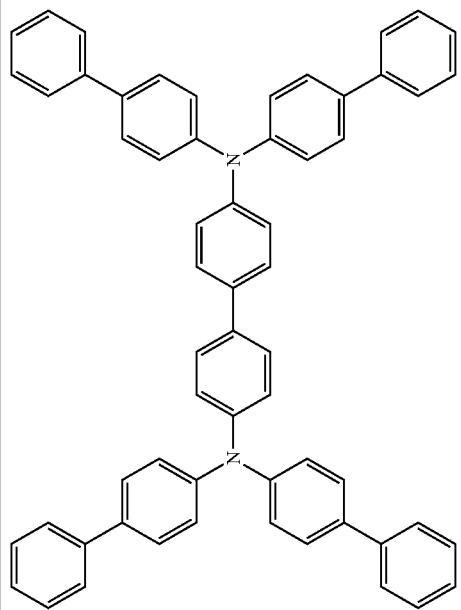
J. Mater. Chem. 3, 319 (1993)
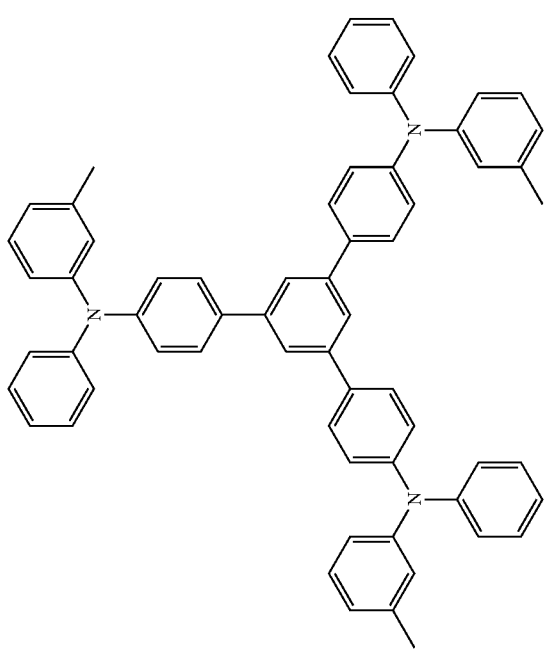

TABLE 1-continued
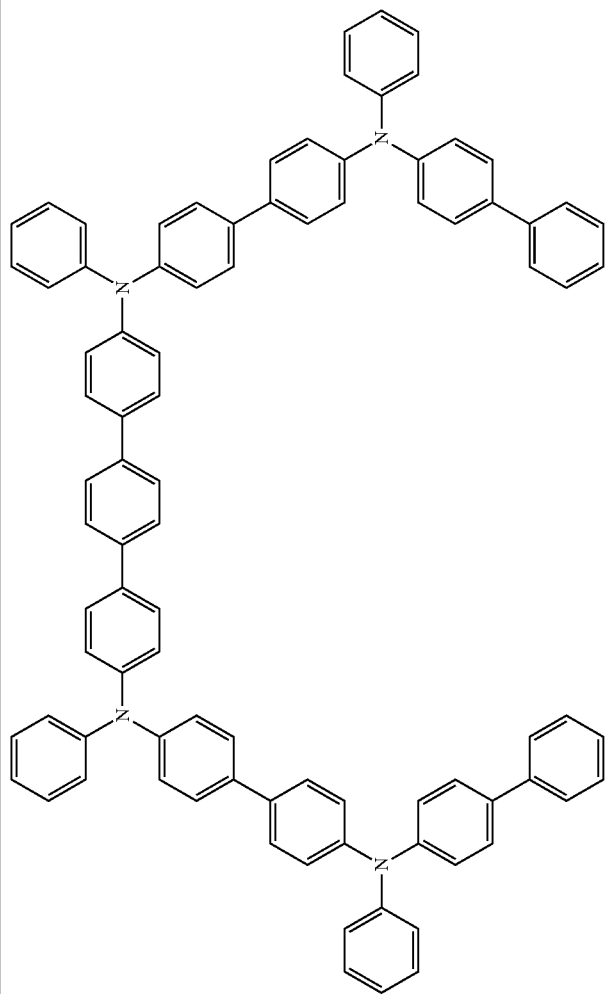
Appl. Phys. Lett. 90, 183503 (2007)
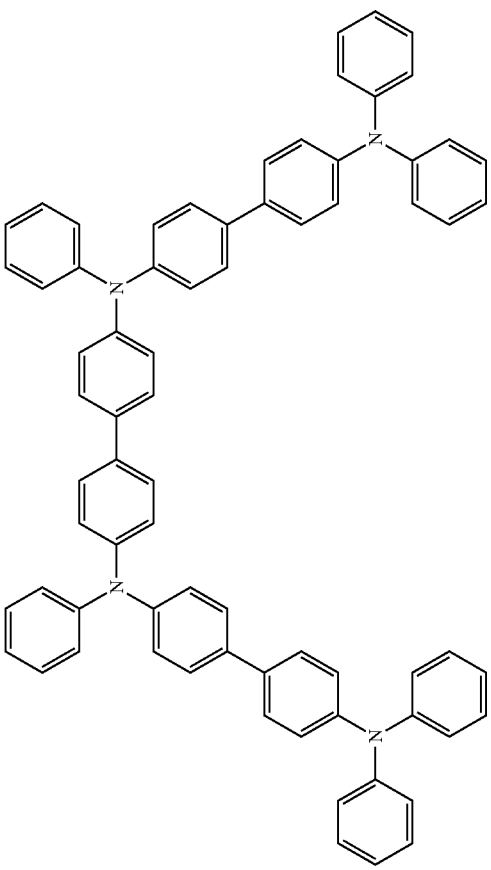
Appl. Phys. Lett. 90, 183503 (2007)

TABLE 1-continued
| | | |
|---|---|---|
| Triarylamine on spirofluorene core | 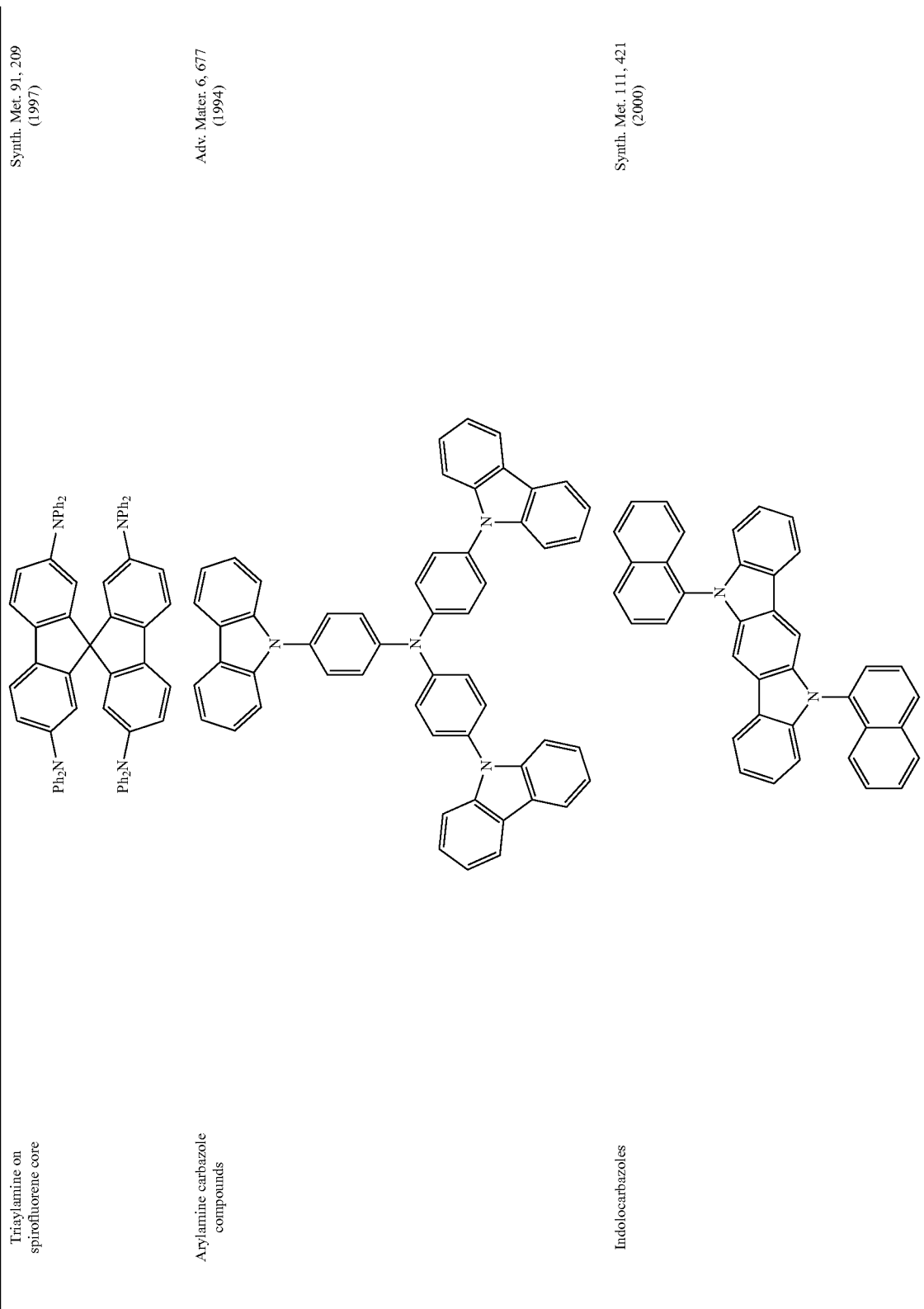 | Synth. Met. 91, 209 (1997) |
| Arylamine carbazole compounds | | Adv. Mater. 6, 677 (1994) |
| Indolocarbazoles | | Synth. Met. 111, 421 (2000) |

TABLE 1-continued

| | | |
|---|---|---|
| Isoindole compounds | (structure: hexaphenylbenzene fused isoindole with N-ethylcarbazole substituent) | Chem. Mater. 15, 3148 (2003) |
| Phosphorescent OLED host materials Red hosts | | |
| Arylcarbazoles | (structure: 4,4'-bis(9-carbazolyl)biphenyl, CBP) | Appl. Phys. Lett. 78, 1622 (2001) |
| Metal 8-hydroxyquinolates (e.g., Alq₃, BAlq) | (structure: Al(q)₃) | Nature 395, 151 (1998) |

TABLE 1-continued
| | | |
|---|---|---|
| | 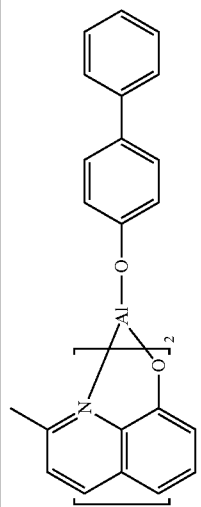 | US20060202194 |
| | 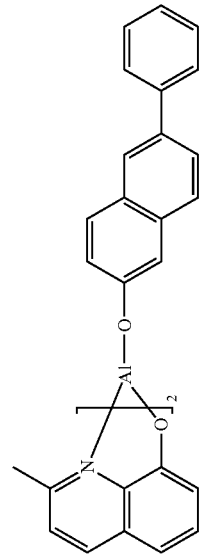 | WO2005014551 |
| Metal phenoxybenzothiazole compounds | 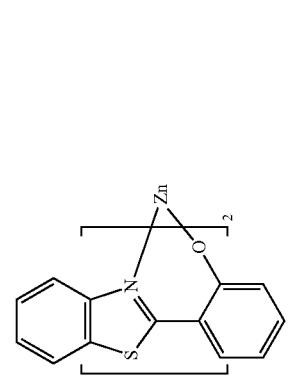 | Appl. Phys. Lett. 90, 123509 (2007) |
| Conjugated oligomers and polymers (e.g., polyfluorene) | 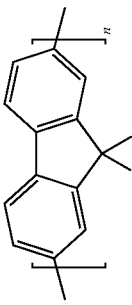 | Org. Electron. 1, 15 (2000) |

TABLE 1-continued
Green hosts
| | | |
|---|---|---|
| Arylcarbazoles | 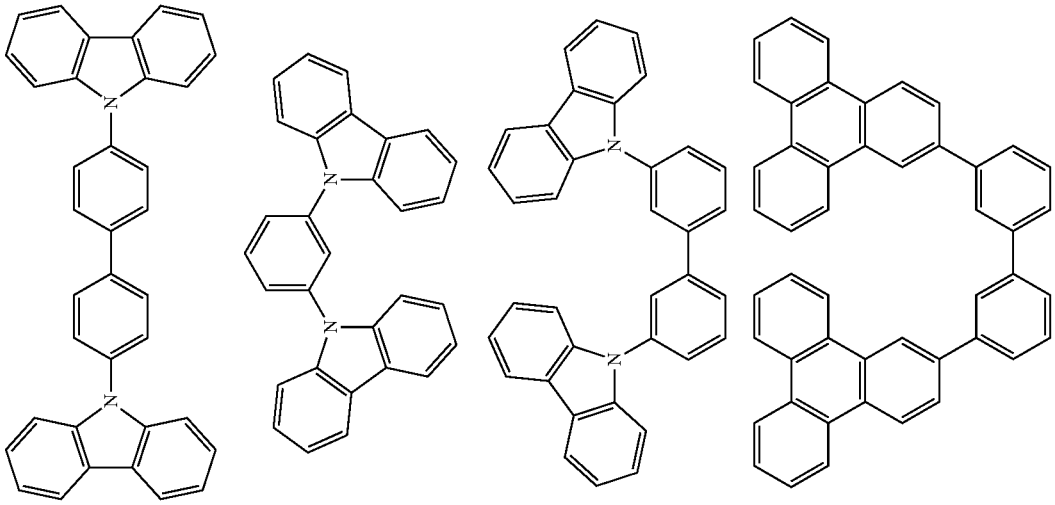 | Appl. Phys. Lett. 78, 1622 (2001) |
| | | US2003175553 |
| | | WO2001039234 |
| Aryltriphenylene compounds | | US2006280965 |

TABLE 1-continued
| | | |
|---|---|---|
| Polymers (e.g., PVK) | 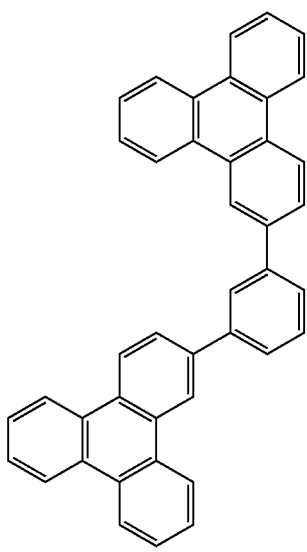 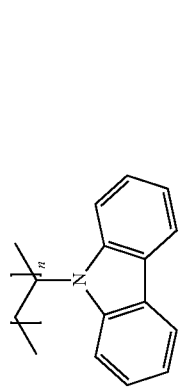 | US20060280965<br>Appl. Phys. Lett. 77, 2280 (2000) |
| Spirofluorene compounds | 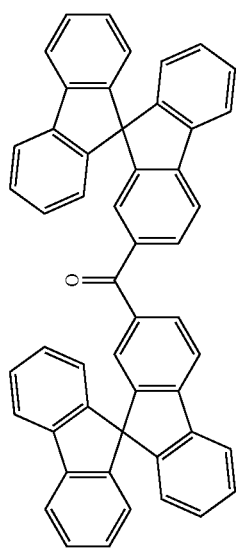 | WO2004093207 |
| Metal phenoxybenzooxazole compounds | 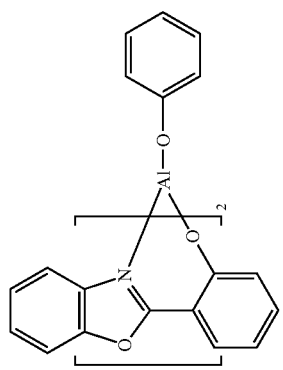 | WO05089025 |

TABLE 1-continued
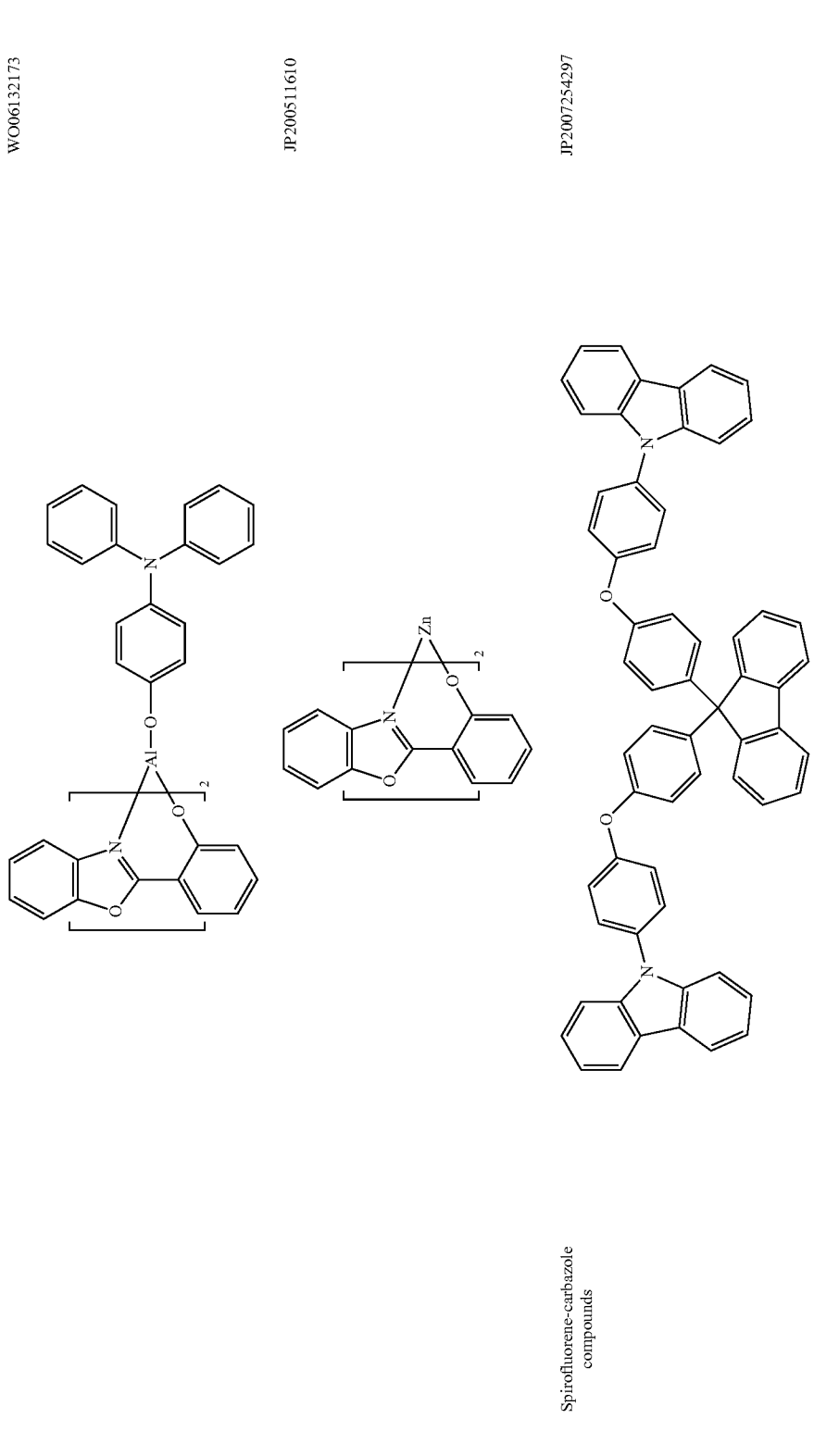
WO06132173
JP200511610
JP200725297
Spirofluorene-carbazole compounds TABLE 1-continued
| | | |
|---|---|---|
| | | JP2007254297 |
| Indolocabazoles | | WO07063796 |
| | | WO07063754 |
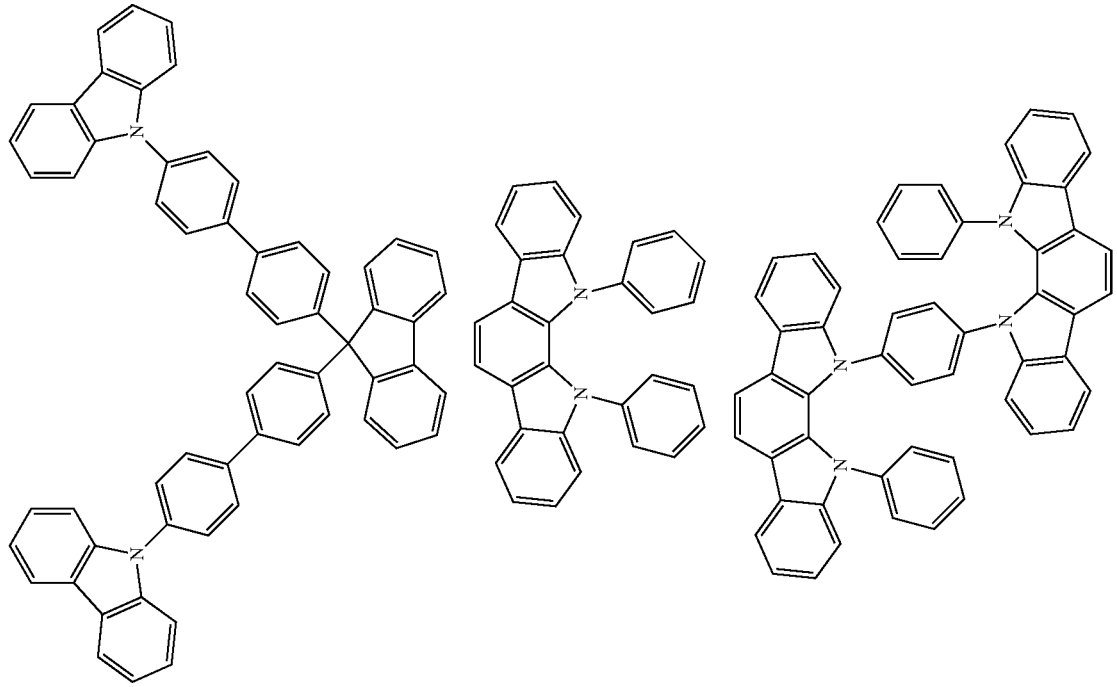

TABLE 1-continued
| | | |
|---|---|---|
| 5-member ring electron deficient heterocycles (e.g. triazole, oxadiazole) | 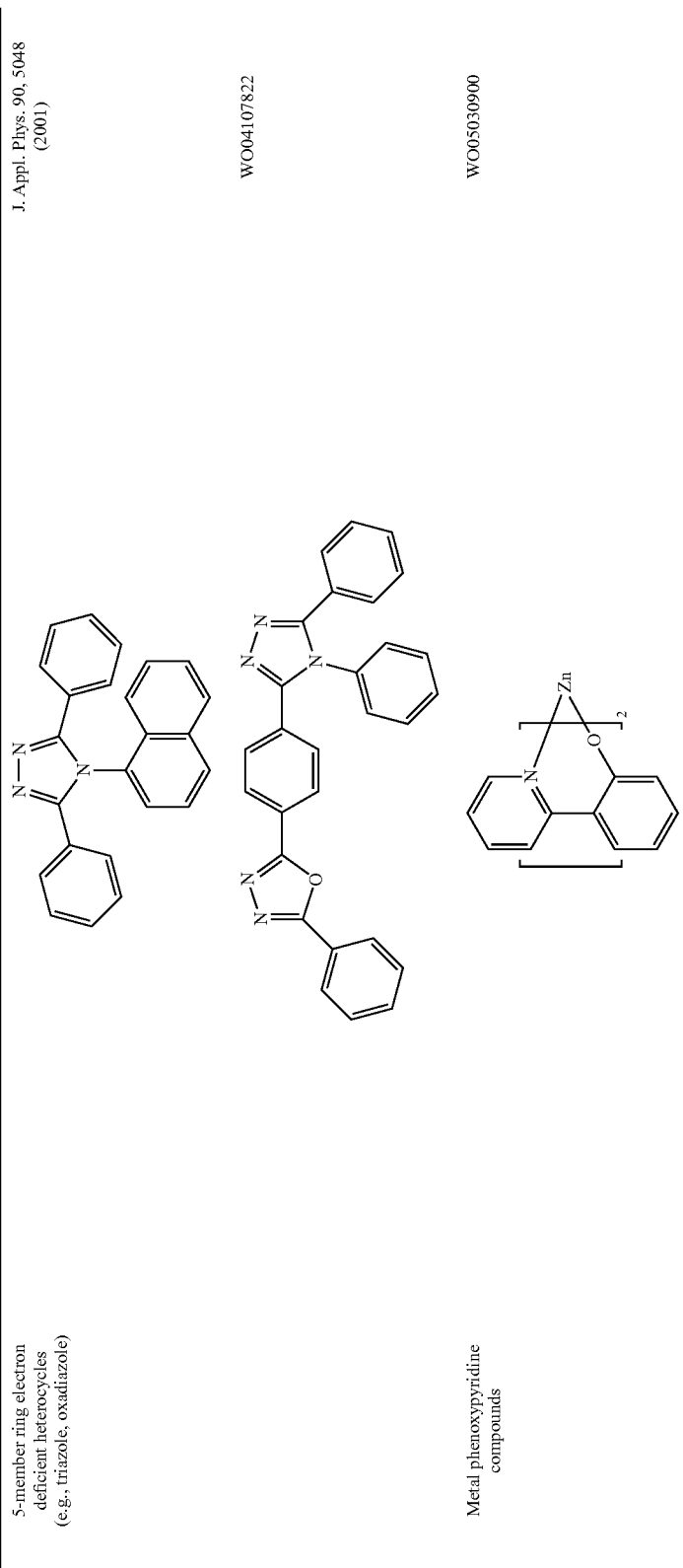 | J. Appl. Phys. 90, 5048 (2001) |
| | | WO04107822 |
| Metal phenoxypyridine compounds | 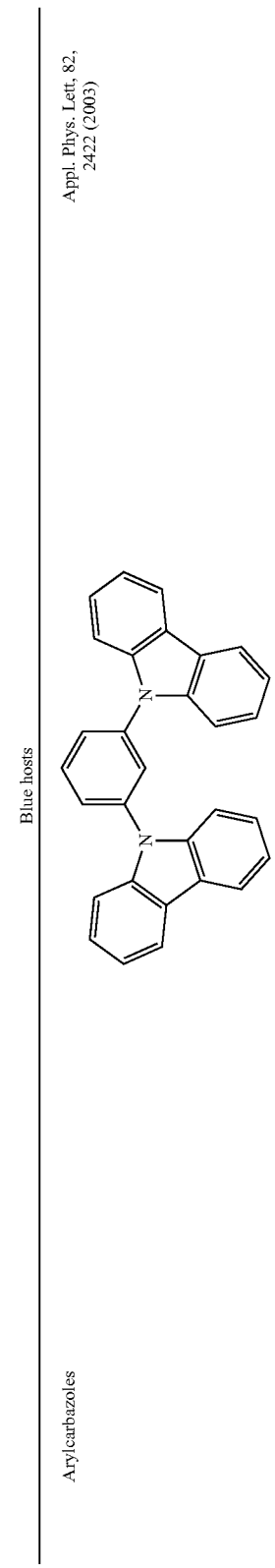 | WO05030900 |
| | Blue hosts | |
| Arylcarbazoles | | Appl. Phys. Lett. 82, 2422 (2003) |

TABLE 1-continued
| | | |
|---|---|---|
| Dibenzothiophene-carbazole compounds | 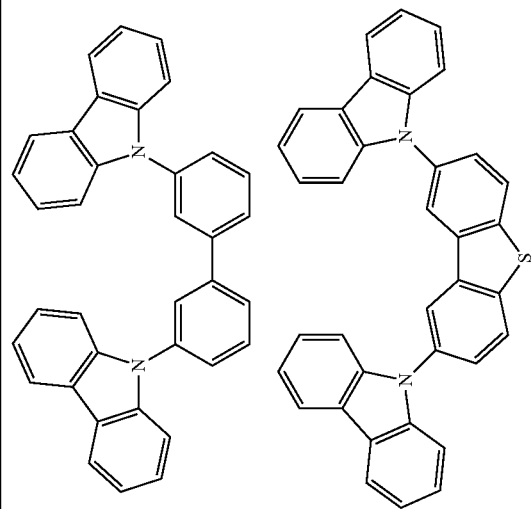 | US20070190359 WO2006114966 |
| Phosphorescent dopants<br>Red dopants | | |
| Heavy metal porphyrins (e.g., PtOEP) | 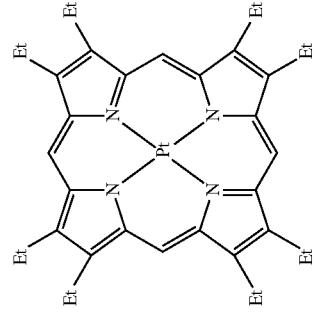 | Nature 395, 151 (1998) |

TABLE 1-continued
Iridium(III) organometallic complexes
| | | |
|---|---|---|
| 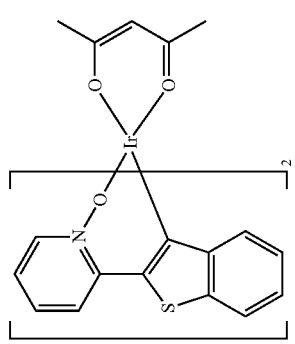 | 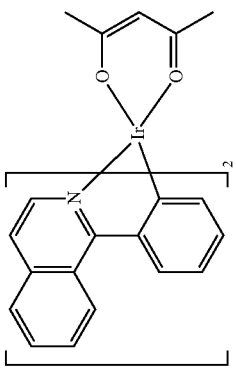 | 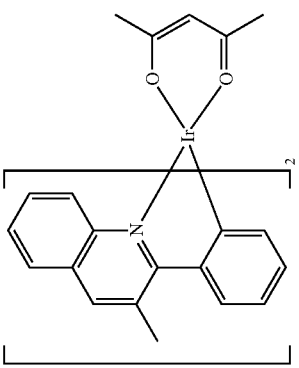 |
| Appl. Phys. Lett. 78, 1622 (2001) | US06835469 | US06835469 |

TABLE 1-continued
| US20060202194 | US20060202194 | US07087321 |
|---|---|---|
| 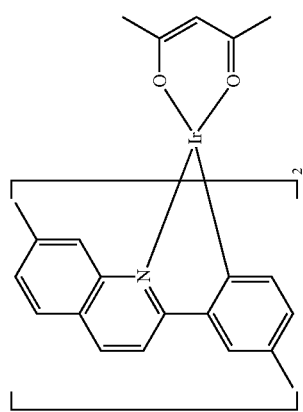 | 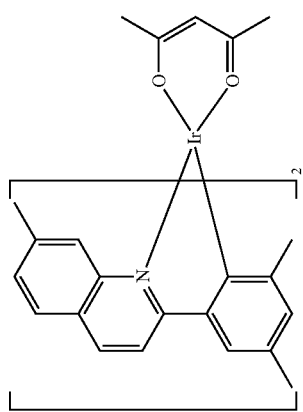 | 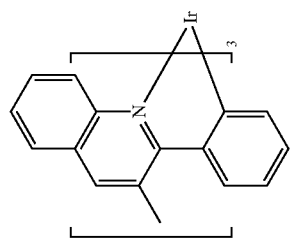 |

TABLE 1-continued
| | | |
|---|---|---|
| | 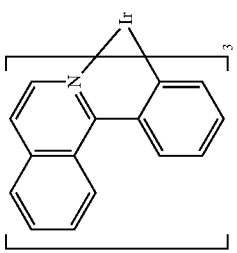 | US07087321<br><br>Adv. Mater. 19, 739 (2007) |
| Platinum(II) organometallic complexes | 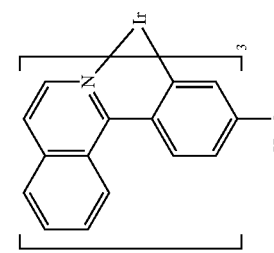 | WO2003040257 |
| Osmium(III) complexes | 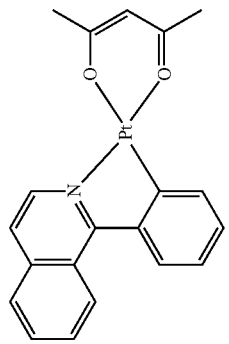 | Chem. Mater. 17, 3532 (2005) |

TABLE 1-continued
| | | |
|---|---|---|
| Ruthenium(II) complexes | 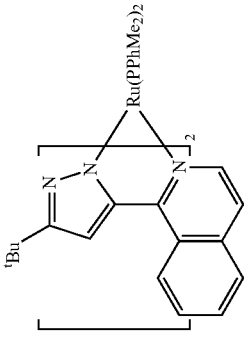 | Adv. Mater. 17, 1059 (2005) |
| Green dopants | | |
| Iridium(III) organometallic complexes | 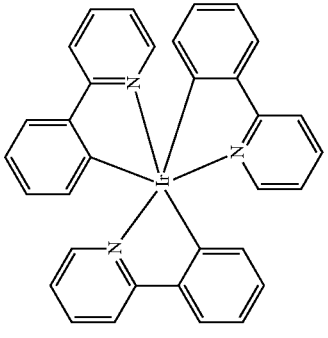 and its derivatives | Inorg. Chem. 40, 1704 (2001) |
| | 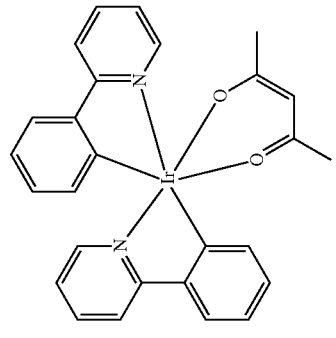 | US2002034656 |

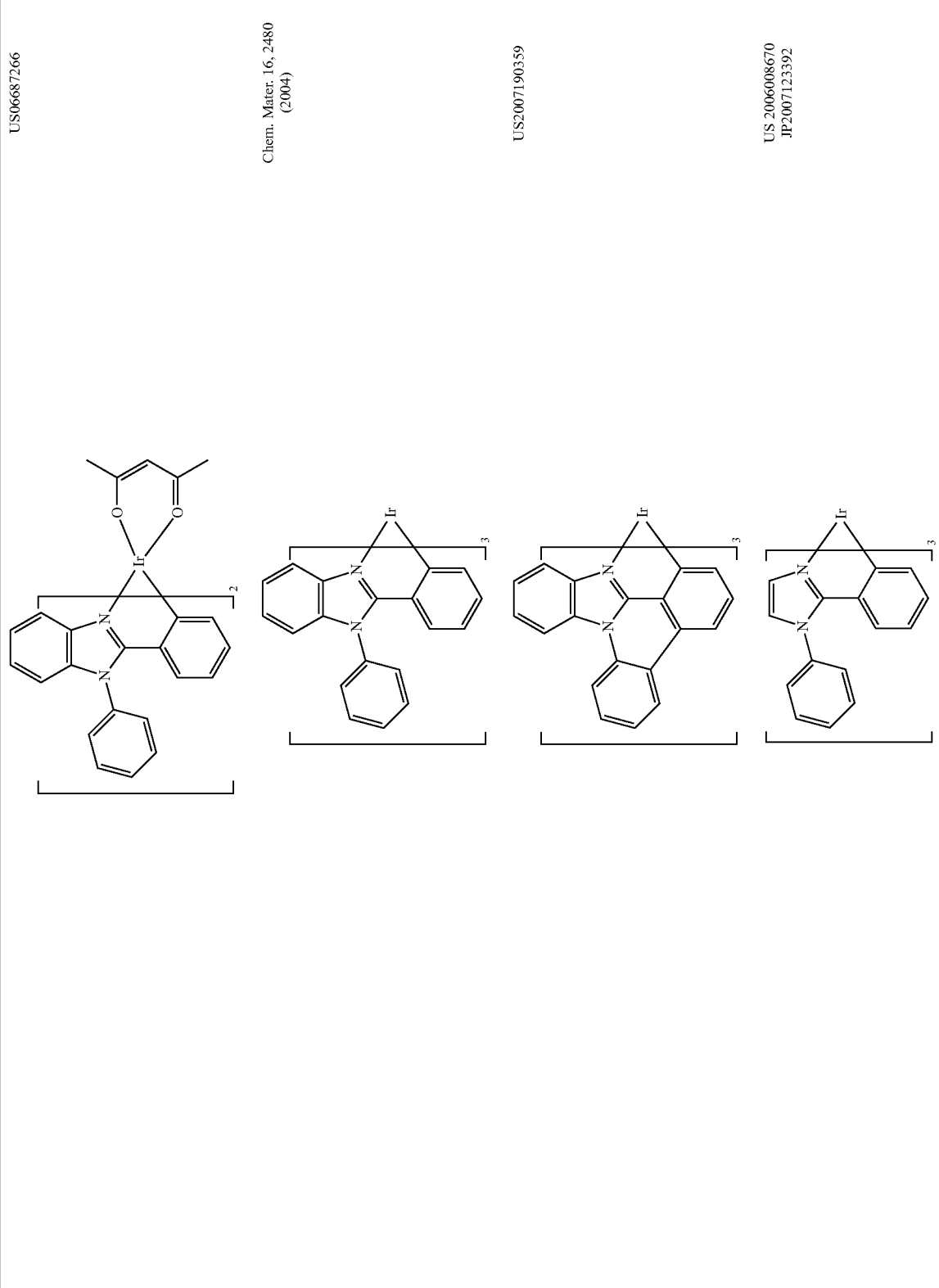

TABLE 1-continued
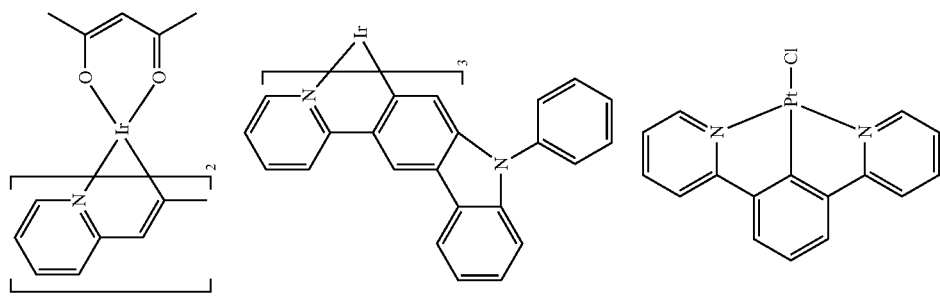
Adv. Mater. 16, 2003 (2004)
Angew. Chem. Int. Ed. 2006, 45, 7800
Appl. Phys. Lett. 86, 153505 (2005)
Pt(II) organometallic complexes TABLE 1-continued
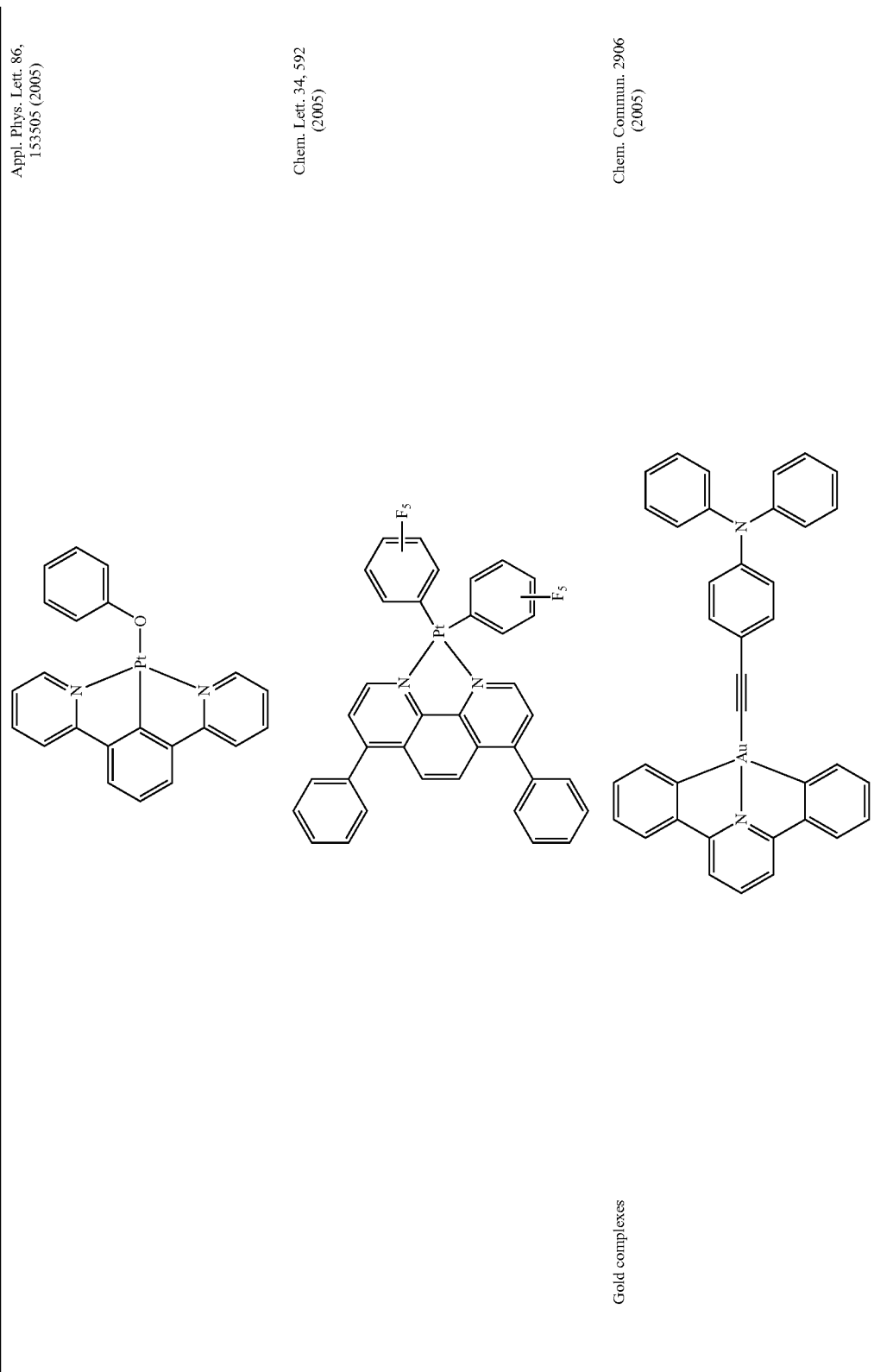
Appl. Phys. Lett. 86, 153505 (2005)
Chem. Lett. 34, 592 (2005)
Chem. Commun. 2906 (2005)
Gold complexes TABLE 1-continued

| | | |
|---|---|---|
| Rhenium(III) complexes | | Inorg. Chem. 42, 1248 (2003) |
| Iridium(III) organometallic complexes | Blue dopants | WO2002002714 |
| | | WO2006009024 |
| | | US2006251923 |

TABLE 1-continued
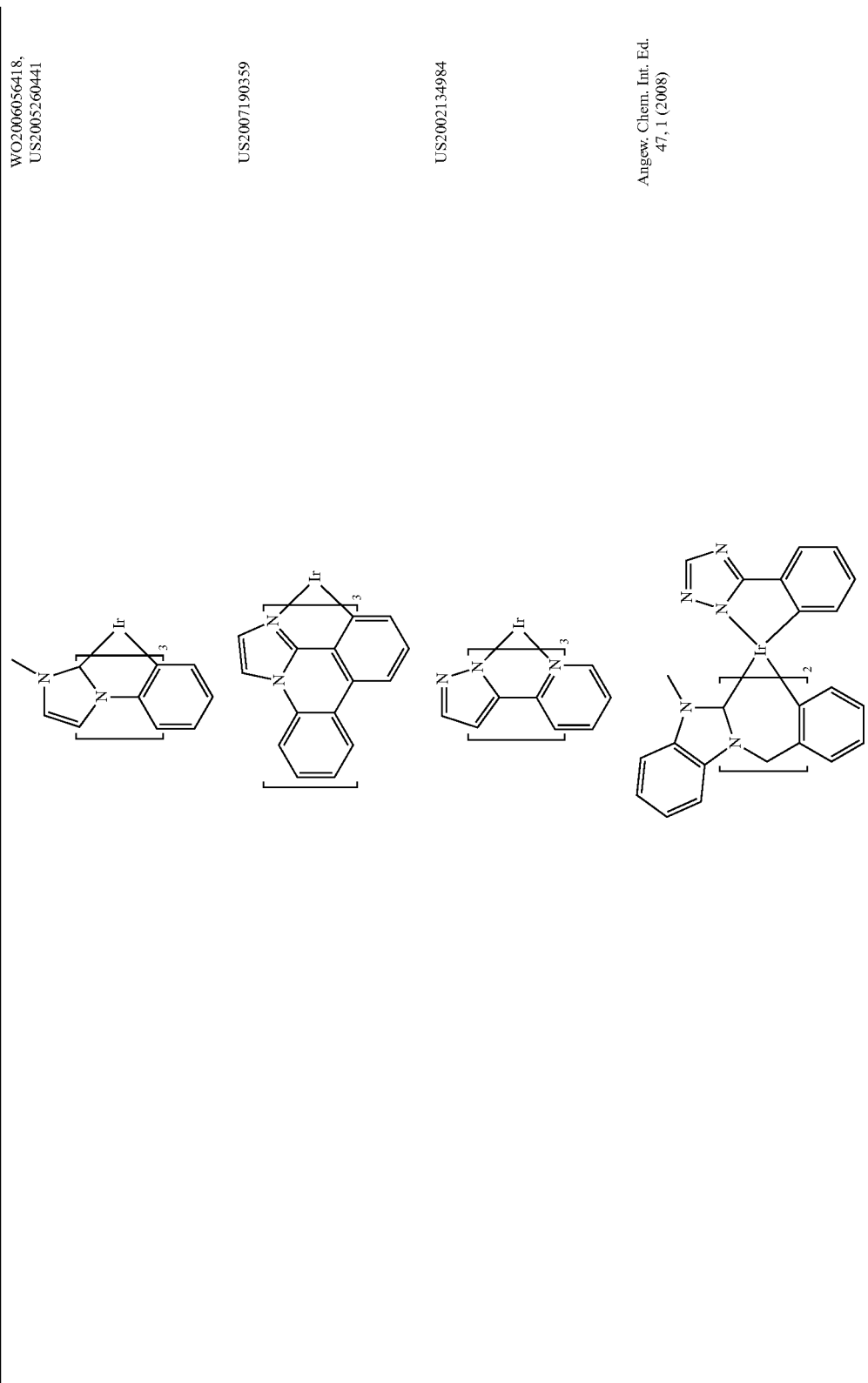
WO2006056418, US2005260441
US2007190359
US2002134984
Angew. Chem. Int. Ed. 47, 1 (2008)

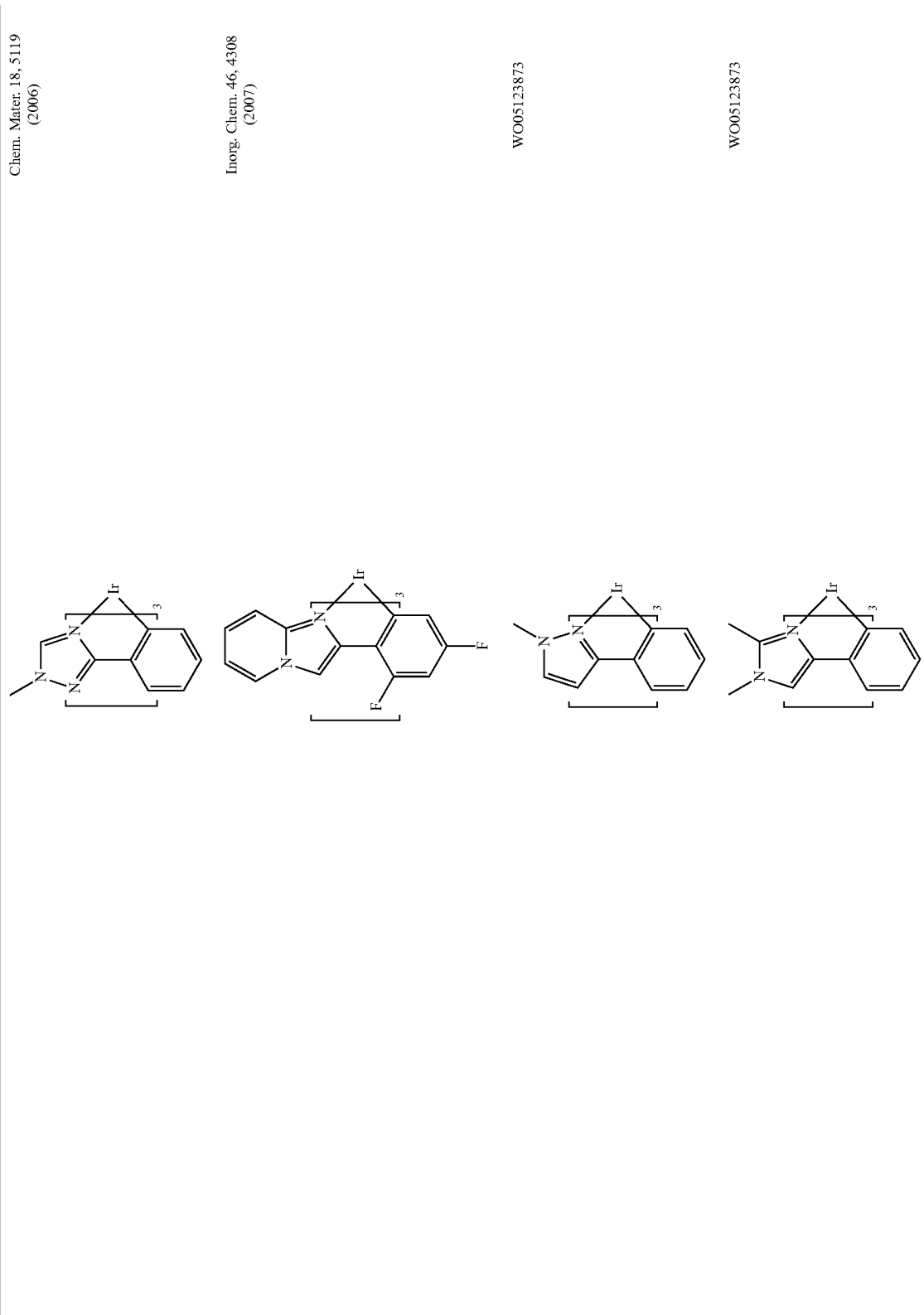

TABLE 1-continued
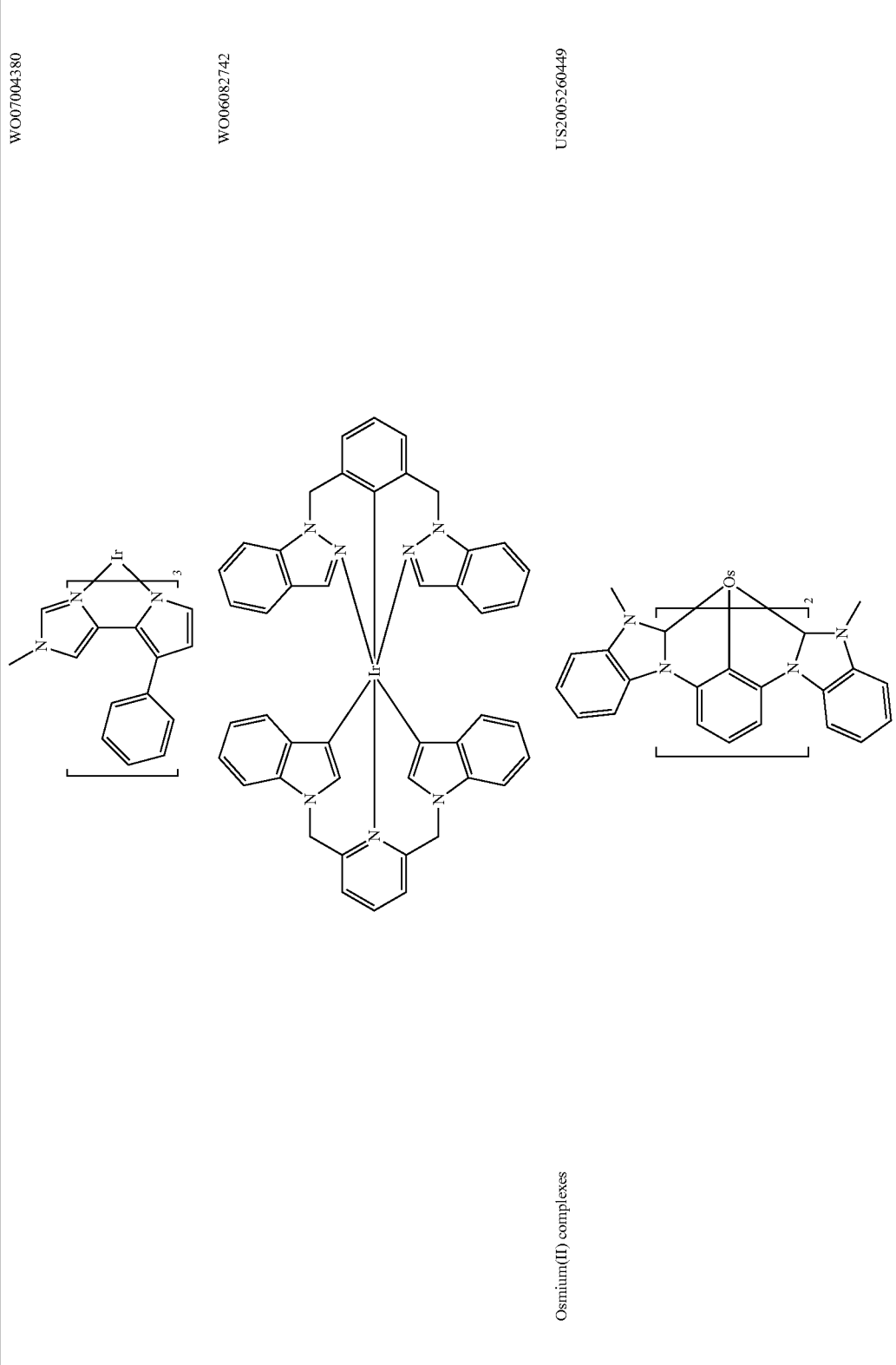
WO07004380
WO06082742
US2005260449
Osmium(II) complexes TABLE 1-continued

| | | |
|---|---|---|
| Gold complexes | [structure with Os(PPh₃)₂, pyrazole-pyridine] | Organometallics 23, 3745 (2004) |
| | [Ph₂P-CH₂-CH₂-PPh₂ with Au-Cl groups] | Appl. Phys. Lett. 74, 1361 (1999) |
| Platinum(II) complexes | [Pt complex with tris(pyrazolyl)borate and thiophene-pyridine ligand] | WO06098120, WO06103874 |
| Exciton/hole blocking layer materials | | |
| Bathocuprine compounds (e.g., BCP, BPhen) | [BCP structure] | Appl. Phys. Lett. 75, 4 (1999) |
| | [BPhen structure] | Appl. Phys. Lett. 79, 449 (2001) |

TABLE 1-continued
| | | |
|---|---|---|
| Metal 8-hydroxyquinolates (e.g., BAlq) | 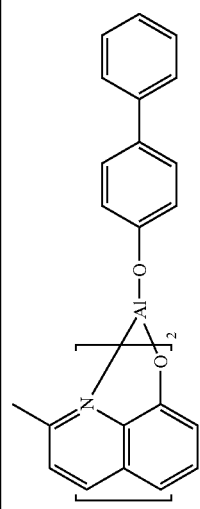 | Appl. Phys. Lett. 81, 162 (2002) |
| 5-member ring electron deficient heterocycles such as triazole, oxadiazole, imidazole, benzoimidazole | 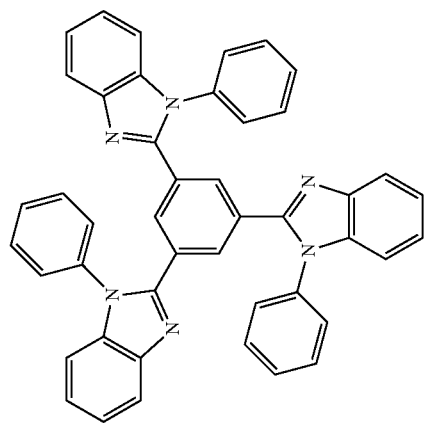 | Appl. Phys. Lett. 81, 162 (2002) |
| Triphenylene compounds | 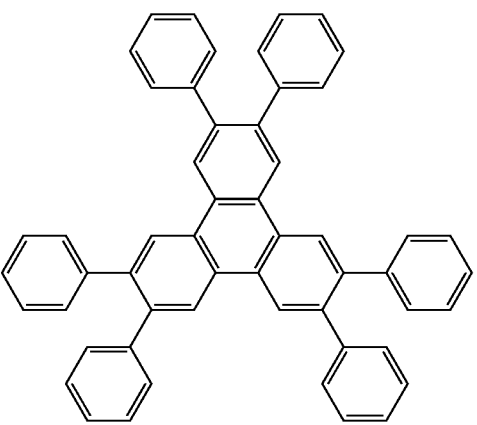 | US2005025993 |

TABLE 1-continued
| Fluorinated aromatic compounds | 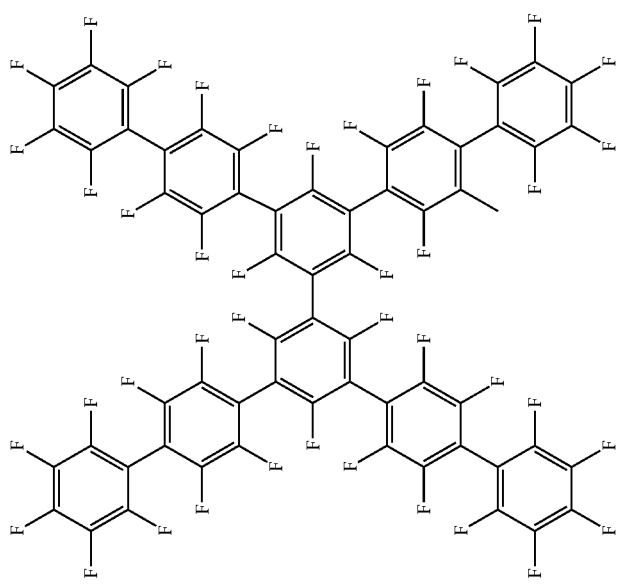 | Electron transporting materials | Appl. Phys. Lett. 79, 156 (2001) |

TABLE 1-continued
| | | |
|---|---|---|
| Anthracene-benzoimidazole compounds | 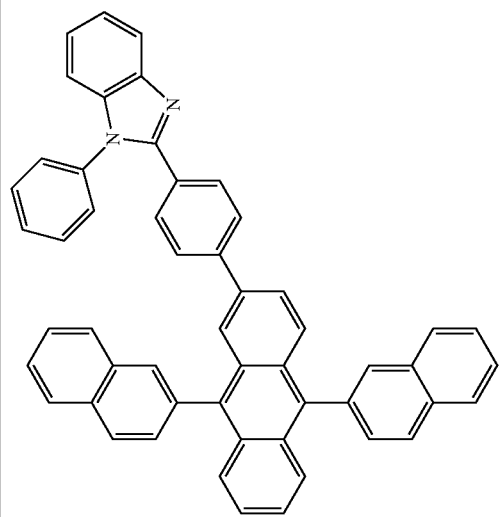 | WO03060956 |
| Anthracene-benzothiazole compounds | 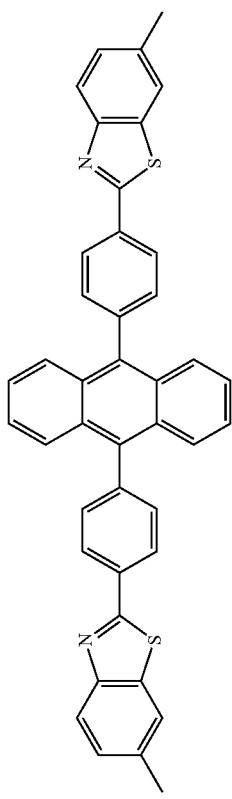 | Appl. Phys. Lett. 89, 063504 (2006) |

TABLE 1-continued

| | | |
|---|---|---|
| Metal 8-hydroxyquinolates (e.g., Alq₃) | [structure] | Appl. Phys. Lett. 51, 913 (1987) |
| Metal hydroxybenoquinolates | [structure] | Chem. Lett. 5, 905 (1993) |
| Bathocuprine compounds such as BCP, BPhen, etc | [structure] | Appl. Phys. Lett. 91, 263503 (2007) |
| | [structure] | Appl. Phys. Lett. 79, 449 (2001) |

TABLE 1-continued
| 5-member ring electron deficient heterocycles (e.g. triazole, oxadiazole, imidazole, benzoimidazole) | 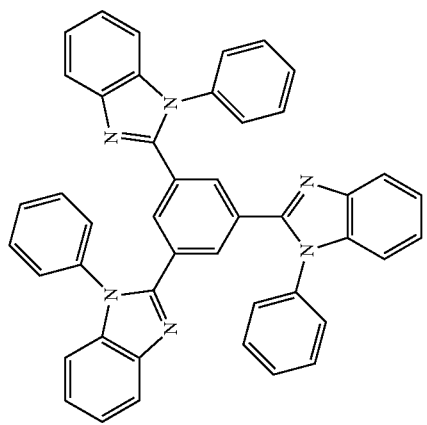 | 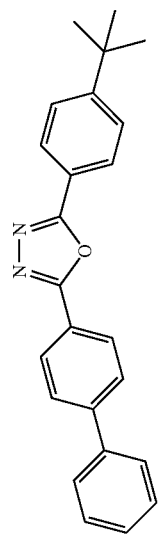 | 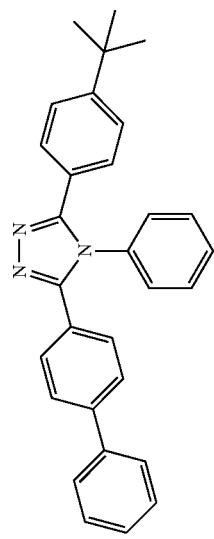 | Appl. Phys. Lett. 74, 865 (1999) Appl. Phys. Lett. 55, 1489 (1989) Jpn. J. Apply. Phys. 32, L917 (1993) |

TABLE 1-continued

| | | |
|---|---|---|
| Silole compounds | | Org. Electron. 4, 113 (2003) |
| Arylborane compounds | | J. Am. Chem. Soc. 120, 9714 (1998) |
| Fluorinated aromatic compounds | | J. Am. Chem. Soc. 122, 1832 (2000) |

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described herein are non-limiting examples of materials that may be useful in combination with the compounds disclosed herein, and one of skill in the art can readily consult the literature to identify other materials that may be useful in combination.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore includes variations from the particular examples and preferred embodiments described herein, as will be apparent to one of skill in the art. It is understood that various theories as to why the invention works are not intended to be limiting.

The invention claimed is:

1. A device, comprising:
   a first subpixel;
   a second subpixel;
   an anode;
   a cathode;
   wherein at least one of the anode and the cathode has independently addressable first and second regions corresponding to the first and second subpixels;
   an emissive stack disposed between the anode and the cathode, the emissive stack further comprising:
      a first organic emissive layer disposed between the anode and the cathode, the first organic emissive layer extending throughout the first and second regions;
      a second organic emissive layer disposed between the anode and the cathode, the second organic emissive layer extending throughout the second region but not the first region, wherein the second organic emissive layer is disposed closer to the cathode than the first organic emissive layer;
   wherein the first organic emissive layer is emissive in the first region, and the second organic emissive layer is emissive in the second region.

2. The device of claim 1, the device further comprising:
   a third subpixel;
   wherein at least one of the anode and the cathode has independently addressable first, second and third regions corresponding to the first, second and third subpixels;
   wherein the first organic emissive layer extends throughout the first, second and third regions; and
   wherein the emissive stack further comprises a third organic emissive layer disposed between the anode and the cathode, the third organic emissive layer extending throughout the third region but not throughout all of the first, second and third regions.

3. The device of claim 2, wherein the third organic emissive layer is disposed closer to the cathode than the first organic emissive layer.

4. The device of claim 2, wherein the third organic emissive layer is disposed closer to the anode than the first organic emissive layer.

5. The device of claim 2, wherein the second organic emissive layer extends throughout the second region but not the first and third regions.

6. The device of claim 2, wherein the second organic emissive layer extends throughout the second and third regions but not the first region.

7. The device of claim 2, the device further comprising:
   a fourth subpixel;
   wherein at least one of the anode and the cathode has independently addressable first, second, third and fourth regions corresponding to the first, second, third and fourth subpixels;
   wherein the first organic emissive layer extends throughout the first, second, third and fourth regions; and
   wherein the emissive stack further comprises a fourth organic emissive layer disposed between the anode and the cathode, the fourth organic emissive layer extending throughout the fourth region but not throughout all of the first, second, third and fourth regions.

8. The device of claim 7, wherein the fourth organic emissive layer is disposed closer to the cathode than the first organic emissive layer.

9. The device of claim 7, wherein the fourth organic emissive layer is disposed closer to the anode than the first organic emissive layer.

10. The device of claim 1, wherein the first organic emissive layer is a blanket layer.

11. The device of claim 1, wherein the emissive stack further comprises a non-emissive spacer layer disposed between the first organic emissive layer and the second organic emissive layer.

12. The device of claim 1, wherein the first and second organic emissive layers are in direct contact.

13. The device of claim 1, wherein the first organic emissive layer is not emissive in the second region.

14. The device of claim 1, wherein the first organic emissive layer is emissive in the second region.

15. The device of claim 1, wherein the first organic emissive layer further comprises an emissive phosphorescent dopant.

16. The device of claim 15, wherein the emissive phosphorescent dopant has a peak emissive wavelength in the visible spectrum of 500 nm-600 nm.

17. A method of fabricating a device having a first subpixel and a second subpixel, and an anode and a cathode, wherein at least one of the anode and the cathode has independently addressable first and second regions corresponding to the first and second subpixels, the method comprising:
   providing the anode;
   depositing, without the use of a mask, a first organic emissive layer over the anode, the first organic emissive layer extending throughout the first and second regions;
   depositing a second organic emissive layer over the first organic emissive layer, the second organic emissive layer extending throughout the second region but not the first region;
   depositing the cathode over the second organic emissive layer;
   wherein the first organic emissive layer is emissive in the first region, and the second organic emissive layer is emissive in the second region.

* * * * *